US012704789B2

(12) United States Patent
Chouaib et al.

(10) Patent No.: US 12,704,789 B2
(45) Date of Patent: Aug. 11, 2026

(54) FLEXIBLE MEASUREMENT MODELS FOR MODEL BASED MEASUREMENTS OF SEMICONDUCTOR STRUCTURES

(71) Applicant: KLA Corporation, Milpitas, CA (US)

(72) Inventors: Houssam Chouaib, Milpitas, CA (US); Tianrong Zhan, Shanghai (CN); Jonathan Iloreta, Menlo Park, CA (US); Teng Gu, Shanghai (CN); Andrei V. Shchegrov, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 107 days.

(21) Appl. No.: 18/231,181

(22) Filed: Aug. 7, 2023

(65) Prior Publication Data

US 2025/0053096 A1 Feb. 13, 2025

(51) Int. Cl.
*G03F 7/00* (2006.01)

(52) U.S. Cl.
CPC ...... *G03F 7/70633* (2013.01); *G03F 7/70625* (2013.01); *G03F 7/706831* (2023.05)

(58) Field of Classification Search
CPC ............. G03F 7/70625; G03F 7/70633; G03F 7/706831; B82Y 30/00; G06F 30/17; H01L 21/67242; H01L 22/14; H01L 22/26; H01L 22/34; G01R 31/309; G01R 31/311
See application file for complete search history.

(56) References Cited

U.S. PATENT DOCUMENTS 5,608,526 A 3/1997 Piwonka-Corle et al.
5,859,424 A 1/1999 Norton et al.
6,429,943 B1 8/2002 Opsal et al.
6,633,831 B2 10/2003 Nikoonahad et al.
6,657,736 B1 * 12/2003 Finarov ............. G01N 21/4788 356/369

(Continued)

OTHER PUBLICATIONS

Schlaf, R., et al., "Work function measurements on Indium Tin Oxide films," J. of Electron Spectr. And Related Phenomena 120, 149 (201).

(Continued)

*Primary Examiner* — Deoram Persaud
(74) *Attorney, Agent, or Firm* — Spano Law Group

(57) ABSTRACT

Methods and systems for generating measurement models of complex semiconductor structures based on re-useable, parametric models are presented herein. In some embodiments, the re-useable, parametric models enable measurement of high aspect ratio (HAR) structures having complex shape profiles. In these embodiments, a re-useable, parametric model includes multiple geometric sections each characterized by a different shape profile. Each shape profile is parameterized by at least one shape parameter. In a further aspect, at least one of the multiple geometric sections includes a plurality of subsections. In some other embodiments, the re-useable, parametric models enable measurement of nanowire based semiconductor structures. The re-useable, parametric models described herein are useful for generating measurement models for both optical metrology and x-ray metrology, e.g., soft x-ray metrology and hard x-ray metrology. The resulting measurement models yield more accurate measurement results with improved robustness.

20 Claims, 14 Drawing Sheets

(56) References Cited

U.S. PATENT DOCUMENTS 6,704,661 B1 * 3/2004 Opsal .................... G01B 11/24 702/159
6,734,967 B1 5/2004 Piwonka-Corle et al.
6,816,570 B2 11/2004 Janik et al.
6,895,075 B2 5/2005 Yokhin et al.
6,943,900 B2 * 9/2005 Niu ........................ G03F 7/705 250/559.22
6,972,852 B2 12/2005 Opsal et al.
7,324,193 B2 * 1/2008 Lally ................ G01N 21/95607 700/121
7,478,019 B2 1/2009 Zangooie et al.
7,755,764 B2 7/2010 Kwak et al.
7,826,071 B2 11/2010 Shchegrov et al.
7,907,264 B1 3/2011 Krishnan
7,929,667 B1 4/2011 Zhuang et al.
7,933,026 B2 4/2011 Opsal et al.
8,749,179 B2 6/2014 Liu et al.
8,860,937 B1 10/2014 Dziura et al.
8,879,073 B2 11/2014 Madsen et al.
8,941,336 B1 1/2015 Liu et al.
9,305,341 B2 4/2016 Claypool
9,405,290 B1 8/2016 Malkova et al.
9,595,481 B1 3/2017 Malkova et al.
9,664,734 B2 5/2017 Malkova et al.
9,915,522 B1 3/2018 Jiang et al.
10,458,912 B2 10/2019 Chouaib et al.
10,592,618 B2 * 3/2020 Dirks ...................... G03F 7/705
11,036,898 B2 6/2021 Chouaib et al.
11,573,077 B2 2/2023 Chouaib et al.
2004/0210402 A1 * 10/2004 Opsal ................ G01N 21/4788 702/28
2005/0200859 A1 * 9/2005 Hazart .................. G01B 11/24 703/2
2008/0195342 A1 * 8/2008 Li .......................... G03F 7/705 702/82
2013/0114085 A1 5/2013 Wang et al.
2014/0019097 A1 1/2014 Bakeman
2014/0111791 A1 4/2014 Manassen et al.
2014/0172394 A1 6/2014 Kuznetsov et al.
2014/0222380 A1 8/2014 Kuznetsov et al.
2014/0297211 A1 10/2014 Pandev et al.
2014/0316730 A1 10/2014 Shchegrov et al.
2015/0042984 A1 2/2015 Pandev et al.
2015/0046118 A1 2/2015 Pandev et al.
2015/0058813 A1 2/2015 Kim et al.
2015/0110249 A1 4/2015 Bakeman et al.
2015/0199463 A1 7/2015 Toreta et al.
2016/0109375 A1 4/2016 Pandev et al.
2016/0139032 A1 5/2016 Rampoldi et al.
2016/0141193 A1 5/2016 Pandev et al.
2016/0282105 A1 9/2016 Pandev
2017/0167862 A1 * 6/2017 Dziura .................. G01B 15/02
2018/0059019 A1 3/2018 Chouaib et al.
2019/0017946 A1 1/2019 Wack et al.
2019/0215940 A1 7/2019 Khodykin et al.
2019/0323974 A1 10/2019 Wormington et al.
2020/0184372 A1 6/2020 Wu et al.
2023/0417682 A1 * 12/2023 Shi .................... G01N 21/9501

OTHER PUBLICATIONS

Affans'Ev, V.V., et al., "Internal photoemission at interfaces of high-k insulators with semiconductors and metals," J. Appl. Phys. 102, 081301 (2007).
Zhang, Q., et al., "Tunnel field-effect transistor heterojunction band alignment by internal photoemission spectroscopy," Appl. Phys. Lett. 100, 102104 (2012).
Sato, Y., et al., "Carrier Density Dependence of Optical Band Gap and Work Function in Sn-Doped In2O3 Films," Appl. Phys. Express 3 (2010).
Chouaib, Houssam, et al., "Rapid photoreflectance spectroscopy for strained silicon metrology," Review of Scientific Instruments 79.10, 103106 (2008).
Singh, Jasprit, "Physics of semiconductors and their heterostructures," McGraw-Hill, Inc., 1993, Chapters 4,5.
Chuang, Shun Lien, "Physics of optoelectronics devices," John Wiley & Sons, Inc., 1995, Chapter 7.
A.S. Ferlauto et al., Analytical model for the optical functions of amorphous semiconductors from the near-infrared to ultraviolet: Application in thin film photovoltaics, Journal of Applied Physics, vol. 92, No. 5, Sep. 1, 2002, pp. 2424-2436.
N.V. Nguyen et al., Sub-bandgap defect states in polycrystalline hafnium oxide and their suppression by admixture of silicon, Applied Physics Letters, vol. 87, 192903, (2005).
N.V. Nguyen et al., Optical Properties of Jet-Vapor-Deposited TiAlO and HfAlO Determined by Vacuum Ultraviolet Spectroscopic Ellipsometry, Proceedings of the AIP 2003 International Conference on Characterization and Metrology for ULSI Technology, 683, (2003), pp. 181-185.
J. Price et al., Identification of interfacial defects in high-k gate stack films by spectroscopic ellipsometry, Journal of Vacuum Science & Technology B, vol. 27, No. 1, (2009), pp. 310-312.
J. Price et al., Identification of sub-band-gap absorption features at the HfO2Si(100) interface via spectroscopic ellipsometry, Applied Physics Letters, vol. 91, 061925, (2007).
Douglas J. Paul, "Si/SiGe heterostructures: from material and physics to devices and circuits," Semicond. Sci. Technol. 19 (2004) R75-R108.
International Search Report mailed on Nov. 15, 2024, for PCT Application No. PCT/US2024/039074 filed on Jul. 23, 2024 by KLA Corporation, 4 pages.

* cited by examiner

FLEXIBLE MEASUREMENT MODELS FOR MODEL BASED MEASUREMENTS OF SEMICONDUCTOR STRUCTURES

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and x-ray based metrology techniques offer the potential for high throughput without the risk of sample destruction. A number of techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty. In general, semiconductor device shapes and profiles are changing dramatically along with new process capabilities. In particular, advanced logic and memory devices must meet increasingly demanding specifications for Critical Dimension (CD) profiles. Thus, detailed features of geometric profiles must be measured accurately.

Significant advances in process chemistry have enabled new etch applications. In some examples, High Aspect Ratio (HAR) etch tools are capable of etching away very narrow vertical channels in semiconductor die with aspect ratios, i.e., ratio of height/width, of 80:1, or higher. This capability has enabled flash memory architectures to transition from two dimensional floating-gate architectures to fully three dimensional geometries. In some examples, film stacks and etched structures are very deep (e.g., three or more micrometers in depth) and include an extremely high number of layers (e.g., 400 layers, or more).

As the etch process penetrates deeper into the structure, the etch rate is susceptible to change along the channel. This leads to a non-uniform etch profile, i.e., the Critical Dimension (CD) of a fabricated channel varies as a function of height. Typical semiconductor devices include millions of HAR channels separated from each other by extremely small distances, e.g., tens of nanometers. Thus, etch profile uniformity and parallelism of HAR channels must be controlled to very tight specifications to achieve an acceptable device yield.

High aspect ratio structures create challenges for film and CD measurements. The ability to measure the critical dimensions that define the shapes of holes and trenches of these structures is critical to achieve desired performance levels and device yield. The metrology must be capable of measuring the CD of a continuous profile through a deep channel to determine the location of CD variations and inflection points of profile variations.

In other examples, recently conceived nanowire based semiconductor devices incorporate new complex three-dimensional geometry and materials with diverse orientation and physical properties. Nanowire devices are particularly difficult to characterize, particularly with optical metrology.

In response to these challenges, more complex metrology tools have been developed. Measurements are performed over large ranges of several machine parameters (e.g., wavelength, azimuth and angle of incidence, etc.), and often simultaneously. As a result, the measurement time, computation time, and the overall time to generate reliable results, including measurement recipes and accurate measurement models, increases significantly.

Existing model based metrology methods typically include a series of steps to model and then measure structure parameters. Typically, measurement data (e.g., DOE spectra) is collected from a set of samples or wafers, a particular metrology target, a testing critical dimension target, an in-cell actual device target, an SRAM memory target, etc. An accurate model of the optical response from these complex structures includes a model of the geometric features, dispersion parameter, and the measurement system is formulated. Typically, a regression is performed to refine the geometric model. In addition, simulation approximations (e.g., slabbing, Rigorous Coupled Wave Analysis (RCWA), etc.) are performed to avoid introducing excessively large errors. Discretization and RCWA parameters are defined. A series of simulations, analysis, and regressions are performed to refine the geometric model and determine which model parameters to float. A library of synthetic spectra is generated. Finally, measurements are performed using the library or regression in real time with the geometric model.

Currently, models of device structures being measured are assembled from primitive structural building blocks by a user of a measurement modeling tool. These primitive structural building blocks are simple geometric shapes (e.g., square frusta) that are assembled together to approximate more complex structures. The primitive structural building blocks are sized by the user and sometimes customized based on user input to specify the shape details of each primitive structural building block. In one example, each primitive structural building block includes an integrated customization control panel where users input specific parameters that determine the shape details to match an actual, physical structure being modeled. Similarly, primitive structural building blocks are joined together by constraints that are also manually entered by the user. For example, the user enters a constraint that ties a vertex of one primitive building block to a vertex of another building block. This allows the user to build models that represent a series of the actual device geometries when the size of one building block changes. User-defined constraints between primitive structural building blocks enable broad modeling flexibility. For example, the thicknesses or heights of different primitive structural building blocks can be constrained to a single parameter in multi-target measurement applications. Furthermore, primitive structural building blocks have simple geometric parameterizations which the user can constrain to application-specific parameters. For example, the sidewall angle of a resist line can be manually constrained to parameters representing the focus and dose of a lithography process.

Although models constructed from primitive structural building blocks offer a wide range of modeling flexibility and user control, the model building process becomes very complex and error prone when modeling complex, high aspect ratio structures and nanowire based semiconductor structures. A user needs to assemble primitive structural building blocks together accurately, ensure they are correctly constrained, and parameterize the model in a geometrically consistent manner. Accomplishing this is not an easy task, and users spend significant amounts of time ensuring that their models are correct. In many cases, users do not realize their models are inconsistent and incorrect because it is difficult to comprehend how all of the primitive structural building blocks change shape and location in parameter space. Specifically, it is very difficult to determine if models that are structurally consistent for a given set of parameter values remain structurally consistent for another set of parameter values.

FIG. 1A depicts twelve different primitive structural building blocks 11-22 assembled together to form an optical critical dimension (OCD) model 10 depicted in FIG. 1B. Each primitive structural building block is rectangular in shape. To construct OCD model 10 a user must manually define the desired dimensions, constraints, and independent parameters (e.g., parameters subject to variation) of the model. Models constructed based on primitive structural building blocks (i.e., basic shapes such as rectangles) typically require a large number of primitives, constraints, and independent parameters for which the user must define ranges of variation. This makes model-building very complex and prone to user errors.

Furthermore, model complexity makes it difficult for one user to understand models built by another. The user needs to be able to understand the intent of the original model owner and this becomes increasingly challenging as the number of primitive structural building blocks, constraints, and independent parameters increases. Consequently, transferring ownership of models (e.g., from applications engineers to process engineers) is a time consuming, difficult process. In many cases, the complexity of the models leads to frustration amongst colleagues, and in some cases, prevents the transfer process from ever being fully completed. In some examples, a user generates a new model from primitive structural building blocks to mimic a model generated by a colleague. In many cases the resulting model is slightly different, and therefore delivers slightly different results due to the non-commutative property of floating point operations on computers. In some other examples, a user surrenders or risks intellectual property by having another firm develop the model.

Existing primitive structural building blocks were designed to model planar complementary metal oxide semiconductor (CMOS) structures and vertical FinFET structures. For these applications, the current primitive structural building blocks offer a wide range of modeling flexibility and provide a fair approximation of actual geometry with good measurement accuracy. Physical gaps in these traditional structures were limited, and existing primitive structural building blocks have been effective.

Unfortunately, existing primitive structural building blocks are inadequate for modeling many advanced memory and logic device structures. The most advanced memory and logic device structures, e.g., nanowire structures, forksheet structures, complementary field effect transistor (CFET) structures, multi-deck VNAND structures, etc., incorporate dramatic topographic changes. The model building process with existing primitive structural building blocks is very complex and error prone. Existing primitive structural building blocks are not sufficiently flexible to accurately represent the shapes encountered in modern semiconductor fabrication processes. As a result, model accuracy suffers. Even if a user accurately assembles several primitive structural building blocks together, sets the correct constraints without error, and reparametrizes the model in a consistent way, the resulting model is not accurate enough to represent real high aspect ratio structures and nanowire based semiconductor structures. In addition, building an approximate model of these structures with currently available structural building blocks is an error prone task. Users spend significant amounts of time ensuring that their models are implemented as planned and designed. In many cases the complex assemblies of available structural building blocks result in inconsistent and incorrect models. In many cases, some layers cannot be modelled using existing structural building blocks at all.

In summary, modelling of high aspect ratio structures and nanowire based semiconductor structures with existing structural building blocks requires the specification of a large number of structural primitives, constraints, and independent parameters. Users spend a significant amount of time building an approximate structure. The process is error prone and not flexible. Users manually define the desired dimensions, set the constraints, and specify values of the independent parameters. In spite of this effort, in many examples, the resulting models are not capable of modelling the structures with any useful accuracy.

A set of primitive nanowire building blocks are described in U.S. Pat. No. 11,036,898 by Houssam Chouaib et al., and assigned to KLA-Tencor Corporation, the content of which is incorporated herein by reference in its entirety. The primitive nanowire building blocks are employed to accurately model the geometry of semiconductor devices fabricated in accordance with nanowire fabrication processes. Each primitive nanowire building block is fully defined by the values of the independent parameters entered by the user. No other user input is required to define the shape of the primitive nanowire building block. This significantly simplifies the model building process associated with nanowire based semiconductor structures. This leads to much faster modeling of complex, nanowire based, semiconductor devices with fewer errors. However, the nanowire building blocks presented in U.S. Pat. No. 11,036,898 are limited in their ability to accurately capture critical dimensions of high aspect ratio structures, in particular, their complex shape profiles.

Until recently, metrology structures remained simple enough that new models were commonly designed for each project. However, modeling of emerging semiconductor structures has resulted in increasingly complicated models with unsatisfactory results. As complex semiconductor structures become more common, and with less time per project, improved modeling methods and tools are desired.

SUMMARY

Methods and systems for generating measurement models of complex semiconductor structures based on re-useable, parametric models are presented herein. In some embodiments, the re-useable, parametric models enable measurement of high aspect ratio (HAR) structures having complex shape profiles. In some other embodiments, the re-useable, parametric models enable measurement of nanowire based semiconductor structures. The re-useable, parametric models described herein are useful for generating measurement models for both optical metrology and x-ray metrology, e.g., soft x-ray metrology and hard x-ray metrology. The resulting measurement models yield more accurate measurement results with improved robustness.

In one aspect, a model building tool includes re-useable, parametric models of complex semiconductor device substructures that are useable as building blocks in a model of a complex semiconductor device. This makes the model building process more intuitive and less error-prone. Furthermore, because the re-useable, parametric sub-structure models are optimized for specific structures and measurement applications, the resulting discretized measurement model is computationally more efficient than traditional models. In addition, the parametric sub-structure models can be saved and shared among different projects and different users.

In a further aspect, a model building tool integrates one or more re-useable, parametric models into a measurement model of a complex semiconductor device. In some embodiments, a model building tool receives input from a user to combine geometric primitives with a re-useable, parametric sub-structure model to form a measurement model. In some other embodiments, a measurement model of a semiconductor device is fully described by one re-useable, parametric model. In some other embodiments, a measurement model of a semiconductor device is fully described by a combination of two or more re-useable, parametric models.

In one aspect, a re-useable, parametric model includes multiple geometric sections each characterized by a different shape profile. Each shape profile is parameterized by at least one shape parameter. In some embodiments, different sections are characterized by the same number of parameters, e.g., polynomials of the same order, but with different parameter values associated with each sub-section. In other embodiments, different sections are characterized by different numbers of parameters, e.g., polynomials of different orders.

In a further aspect, at least one of the multiple geometric sections includes a plurality of subsections. Each subsection is characterized by a different shape profile parameterized by at least one shape parameter. In some embodiments, one or more sections may include multiple sub-sections characterized by the same equation, e.g., polynomials of the same order, but with different parameter values associated with each sub-section. In other embodiments, one or more sections may include multiple sub-sections characterized by different equations, e.g., polynomials of different orders.

Re-useable, parametric models including multiple geometric sections are well suited to model the geometry of high aspect ratio structures, in particular, critical dimensions of high aspect ratio structures. Re-useable, parametric models including multiple geometric sections are very flexible and accurately capture real CD profiles.

In some embodiments, the number of sections and subsections and the parameterization of the shape profile associated with each section and subsection is defined by the user. In some examples, a user specifies the equation associated with each section and subsection. In some other embodiments, the number of sections and subsections is defined by the user and the parameterization of the shape profile associated with each section and subsection is defined automatically based on an expected CD profile. In some other embodiments, the number of sections and subsections and the parameterization of the shape profile associated with each section and subsection is specified automatically based on an expected CD profile.

In some embodiments, the height of each of the multiple geometric sections is defined in absolute terms by a height parameter. The height parameter value may be specified by a user or automatically based on an expected CD profile.

In another further aspect, the height of each of the multiple geometric sections is characterized by a height ratio defined with respect to at least one of the other multiple geometric sections. In this manner, the location of the junction point of shape profiles associated with adjacent geometric sections is specified in terms of the height of other sections. This allows the height of each section to be optimized during the measurement process with a relatively small number of floating variables. This results in a more accurate measurement of the actual CD profile with reduced computational effort.

In another further aspect, the parameterization and initial values of the shape profile associated with each section of a re-useable, parametric model is determined by a trained library selection function based on a reference shape profile associated with a structure under measurement.

In some embodiments, a trained library selection function is a machine learning based model that receives a reference profile associated with a structure under measurement. The reference profile is an expected profile of the structure under measurement derived from a simulation of the fabrication process, user experience, a reference measurement performed by a trusted metrology system, etc. The trained library selection function specifies the shape profile parameterization, i.e., the parameterized mathematical description of the shape profile, associated with each section of the re-useable, parametric model, and initial values of each of the parameters associated with each of each shape profiles that best match the reference profile. In this manner, the computational effort associated with regression of the shape profile parameters to best match actual measurement data with measurement data predicted by the measurement model is minimized.

In another aspect, a set of re-useable, parametric substructure models are employed to accurately model the geometry of next generation semiconductor devices based on nanowire fabrication processes. In some examples, these primitive nanowire building blocks allow a user to build measurement models that represent actual nanowire geometries with high accuracy and allow all possible degrees of freedom. In some examples, metrology systems employ these models to perform model based measurements of geometric parameters, material characteristics, etc., associated with different nanowire fabrication processes.

The set of re-useable, parametric sub-structure models described herein include a rounded square primitive nanowire building block, a rounded trapezoid nanosheet building block, a rounded diamond nanowire building block, and a rounded triangle nanowire building block. In some embodiments, a re-usable, parametric sub-structure model represents one or more conformal layers wrapped around a nanowire. In these embodiments, the independent parameters that define the shape of the model include the thicknesses of each conformal layer, in addition to the parameters characterizing the base structure. Optionally, material parameters associated each of the layers may be defined as independent variables that can be defined by a user.

The foregoing is a summary and thus contains, by necessity, simplifications, generalizations and omissions of detail; consequently, those skilled in the art will appreciate that the summary is illustrative only and is not limiting in any way.

Other aspects, inventive features, and advantages of the devices and/or processes described herein will become apparent in the non-limiting detailed description set forth herein.

DETAILED DESCRIPTION

Figure 1A:
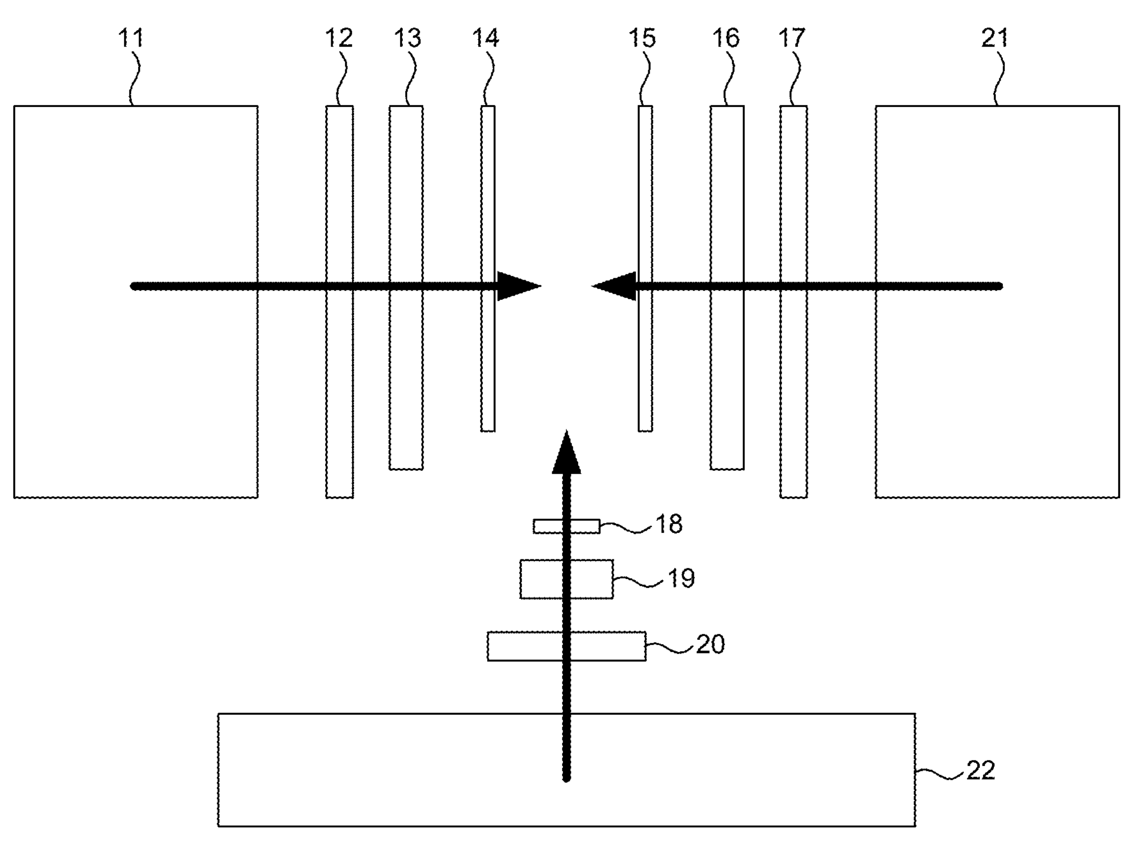
FIG. 1A is a diagram illustrative of twelve different primitive structural building blocks 11-22 assembled together to form an optical critical dimension (OCD) model 10 depicted in FIG. 1B.
Figure 1B:
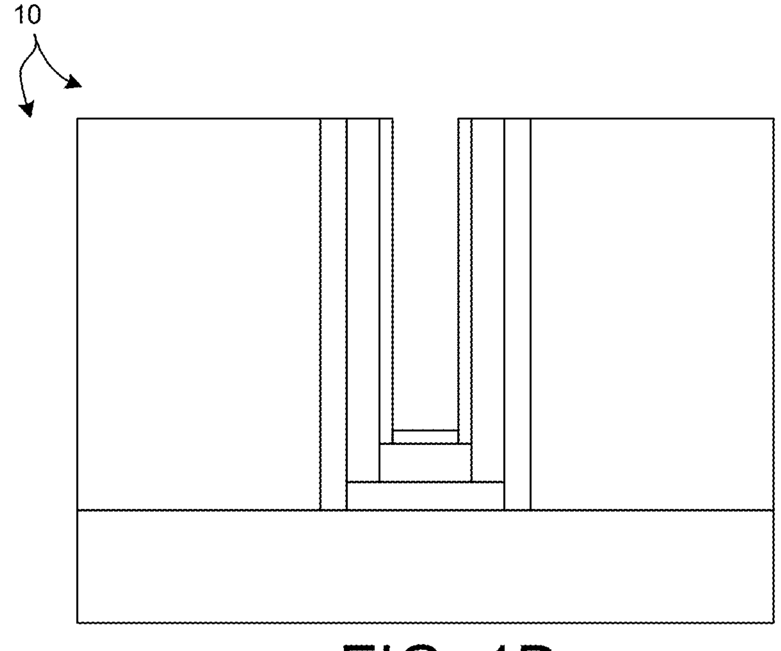
FIG. 1B is a diagram illustrative of an optical critical dimension (OCD) model 10.

Reference will now be made in detail to background examples and some embodiments of the invention, examples of which are illustrated in the accompanying drawings.

Scatterometry based metrology for critical dimensions (CDs), thin film thicknesses, optical properties and compositions, overlay, lithography focus/dose, etc., typically requires a geometric model of the underlying structure to be measured. This measurement model includes a parameterization of the physical dimensions and material properties of the structure.

Methods and systems for generating measurement models of complex semiconductor structures based on re-useable, parametric models are presented herein. Metrology systems employing these models are configured to measure structural and material characteristics (e.g., material composition, dimensional characteristics of structures and films, etc.) associated with advanced semiconductor fabrication processes, e.g., deep etch processes and nanowire processes. In some embodiments, the re-useable, parametric models enable measurement of high aspect ratio (HAR) structures having complex shape profiles. In some other embodiments, the re-useable, parametric models enable measurement of nanowire based semiconductor structures. The re-useable, parametric models described herein enable measurement model generation that is substantially simpler, less error prone, and more accurate. As a result, time to useful measurement results is significantly reduced, particularly when modelling complex semiconductor structures. The re-useable, parametric models described herein are useful for generating measurement models for both optical metrology and x-ray metrology, e.g., soft x-ray metrology and hard x-ray metrology. The resulting measurement models yield more accurate measurement results with improved robustness.

In some examples, re-useable parametric models are employed to generate measurement models of complex memory structures, e.g., 3D flash memory, DRAM cells, multi-deck VNAND structures, etc., and complex logic structures cells, e.g., Gate-All-Around structures, forksheet structures, complementary field effect transistor (CFET) structures, etc.

The relative simplicity of building measurement models using re-useable parametric model elements enables rapid measurement recipe generation. This allows fabrication facilities to quickly refine process conditions to improve yield of FinFET structures, Gate-All-Around structures, DRAM and VNAND memory structures, etc. In many cases, the only other available alternatives to measurement of these high aspect ratio structures are destructive techniques, such as Focused Ion Beam microscopy, and extremely low throughtput techniques, such as Transmission Electron Microscopy (TEM).

In one aspect, a model building tool, e.g., model building and analysis engines 130 and 350 described hereinafter, includes re-useable, parametric models of complex semiconductor device sub-structures that are useable as building blocks in a model of a complex semiconductor device. This makes the model building process more intuitive and less error-prone. Furthermore, because the re-useable, parametric sub-structure models are optimized for specific structures and measurement applications, the resulting discretized measurement model is computationally more efficient than traditional models. In addition, the parametric sub-structure models can be saved and shared among different projects and different users.

In a further aspect, a model building tool integrates one or more re-useable, parametric models into a measurement model of a complex semiconductor device. In some embodiments, a model building tool receives input from a user to combine geometric primitives with a re-useable, parametric sub-structure model to form a measurement model. In some other embodiments, a measurement model of a semiconductor device is fully described by one re-useable, parametric model. In some other embodiments, a measurement model of a semiconductor device is fully described by a combination of two or more re-useable, parametric models.

In another aspect, a model building tool generates a composite nanowire building block model based on input from a user.

In some embodiments, a model building tool generates a re-useable, parametric sub-structure model based on a composition of simpler re-useable, parametric sub-structure models indicated by a user. The composition changes the collection of individual models into a single re-useable, parametric sub-structure model that can be used as an element of a measurement model. The model building tool saves the sub-structure model for later use. Internally, the sub-structure model includes the constraints necessary to fully integrate all of the underlying geometric primitives. These constraints are saved as part of the sub-structure model and are enforced at every instance of the sub-structure model. In this manner, users can create a collection of commonly used complex shapes with pre-defined constraints. The sub-structure model can be unloaded and saved into files, reloaded into a project and used, and shared among users.

The re-useable, parametric sub-structure models generated by the model building tool enable a user or group of users to generate a library of sub-structures that can be reused. Different users who use different instances of the same sub-structure model can expect to achieve the same numerical results.

Re-useable, parametric sub-structure models can be generated in different ways. In one example, a user directs the model building tool to combine and constrain one or more geometric primitives, one or more existing sub-structure models, or any combination by user-generated computer code. This results in a smoother model discretization that yields a more computationally efficient measurement model due to a reduced number of discretization points. In general, models that contain fewer geometric building blocks and fewer constraints result in a faster discretization as the discretization engine no longer needs to parse through so many geometric building blocks and constraints. In some embodiments, the discretization points of a first re-useable, parametric model are aligned with the discretization points of a second re-useable, parametric model within a floating point precision of the underlying computing system to ensure repeatable computational results from the combined model.

In some other examples, a user may interact with a graphical user interface (GUI) that allows a user to select one or more geometric primitives, one or more existing sub-structure models, or any combination, and then indicate the users desire to group these elements together and select the desired independent parameters. In response the model building tool automatically generates the appropriate constraints to realize a fully integrated parametric sub-structure model. The user can then export the newly created parametric sub-structure model into a file that can be used by others. In another example, the newly created parametric sub-structure model can be listed in the model building tool as an available building block that can be selected by a user to construct a measurement model, or yet another, more complex parametric sub-structure model. The re-usable parametric sub-structure models allow multiple users to collaboratively work on different parts of a complex model and assembly them together at the final stage.

The number of components required to assemble a complex device model is significantly reduced by combining two or more re-useable, parametric sub-structure models, rather than geometric primitives. Moreover, the numbers of relationships among the components that must be specified by the user are also significantly reduced. This simplifies the initial model building process, makes it less error-prone, and makes it easier to transfer models between different users.

In another further aspect, the model building tool generates and makes available for use, re-useable, parametric models of complex device sub-structures that include key characteristics of specific semiconductor processes embedded into their design. More specifically, a re-usable, parametric sub-structure model includes controls that allow the user to specify wafer artifacts created by one or more process steps.

In one embodiment, a re-useable, parametric model represents multiple process steps. Furthermore, the user is able to select which process step to model. For example, if a user wants to first model a trench etch process step, the user controls the re-useable, parametric model to include the processes needed to create the trench etch (i.e., the film deposition and trench etch steps). The user would define the material used in the film deposition step, define the thickness of the deposited film, and define the dimensions of the trench. If the user wants to model a planarization step, the user starts with the previously defined trench etch model and then controls the re-useable, parametric model to include the processes needed to create the planarized structure (i.e., the conformal deposition and planarization steps). The user would define the number of conformal depositions and the materials/thicknesses for each deposition define the depth of the planarization. In this manner, the user is able to individually control each of the process steps represented by the re-useable, parametric model. Thus, a single model can be utilized to measure multiple process steps.

In some lithography focus/dose applications, resist lines of stacked device structures are modeled as stacked trapezoids that are constrained in the following manner: 1) the top critical dimension (TCD) and bottom critical dimension (BCD) of adjacent trapezoids are constrained to be equal, 2) the heights of the individual trapezoids are constrained to be equal, 3) the individual critical dimensions are constrained to be functions of user-defined focus and dose parameters, and 4) the height of the individual trapezoids is constrained to be a function of the aforementioned focus and dose parameters. Traditionally, all of these constraints need to be set by the user.

In another further aspect, the model building tool generates and makes available for use, re-useable, parametric models of complex device sub-structures that include measurement application specific details (e.g., constraints, dimensions, etc. that derive from particular applications).

In some examples, the model building tool reads a file that contains the equations of the individual dimensions. This file is typically generated by a lithography simulator such as PROLITH software available from KLA-Tencor Corporation, Milpitas, California (USA). Based on this application information the model building tool automatically sets the parameterization and constraints of the re-usable, parametric sub-structure model.

In another example, the model building tool can also be employed to generate re-usable, parametric sub-structure models that describe field enhancement elements used in some optical metrology applications. Field enhancement elements are described in further detail in U.S. Pat. No. 8,879,073 assigned to KLA-Tencor Corporation, the subject matter of which is incorporated herein by reference its entirety. The model building tool can be employed to generated re-usable, parametric sub-structure models for each type of field enhancement element and different applications.

In yet another example, a model building tool is also employed to generate re-usable, parametric sub-structure models that describe metrology targets generated by metrology target design or overlay design software. In one example, the model building tool receives graphical database system (GDS) data generated by a software simulator and automatically generates re-usable, parametric sub-structure models that predicts the morphology of spacer pitch splitting.

In yet another aspect, the model building tool includes security features to control the sharing of sensitive intellectual property with particular users. For example, it may be desirable for an entity to share a measurement model with another entity, but without sharing particular aspects of the measurement model that include sensitive intellectual property. In some examples, the model building tool allows a user to hide all or part of one or more re-useable, parametric sub-structure models from display to allow the models to be shared with other entities. In some examples, the model building tool allows a user to omit all or part of one or more re-useable, parametric sub-structure models to prevent sharing of these sensitive elements with another entity. In some other examples, the model building tool allows a user to include password protection to control access to all or part of one or more re-useable, parametric sub-structure models to limit the sharing of sensitive elements to authorized entities. In this manner, sensitive intellectual property embodied in certain features of the re-useable, parametric sub-structure models can be kept private by the user.

In a further aspect, the re-useable, parametric sub-structure model is fully defined by the values of the independent parameters entered by the user of the model building tool. All other variables associated with the model shape and internal constraints among constituent geometric elements are pre-defined within the model. Thus, beyond the values of the independent parameters, no other user input is required to fully define the re-useable, parametric sub-structure model. This greatly simplifies the model building process and leads to much faster modeling of complex semiconductor devices with fewer errors.

In one aspect, a re-useable, parametric model includes multiple geometric sections each characterized by a different shape profile. Each shape profile is parameterized by at least one shape parameter. In some embodiments, different sections are characterized by the same number of parameters, e.g., polynomials of the same order, but with different parameter values associated with each sub-section. In other embodiments, different sections are characterized by different numbers of parameters, e.g., polynomials of different orders.

In a further aspect, at least one of the multiple geometric sections includes a plurality of subsections. Each subsection is characterized by a different shape profile parameterized by at least one shape parameter. In some embodiments, one or more sections may include multiple sub-sections characterized by the same equation, e.g., polynomials of the same order, but with different parameter values associated with each sub-section. In other embodiments, one or more sections may include multiple sub-sections characterized by different equations, e.g., polynomials of different orders.

The re-useable, parametric model is fully defined by a set of independent parameters. The set of independent parameters includes the shape parameters characterizing the shape profiles of the geometric sections.

Re-useable, parametric models including multiple geometric sections are well suited to model the geometry of high aspect ratio structures, in particular, critical dimensions of high aspect ratio structures. In some examples, high aspect ratio structures are fabricated from a large number of layers deposited on a semiconductor wafer, e.g., at least 400 material layers. Typically, in these embodiments, the structure under measurement, e.g., hole, channel, etc., is oriented vertically, i.e., the structure is oriented in a direction normal to the planar surface of the wafer. In some other embodiments, the structure under measurement, e.g., a nanosheet lateral profile, is oriented horizontally, i.e., the structure is oriented in a direction parallel to the planar surface of the wafer.

Figure 2:
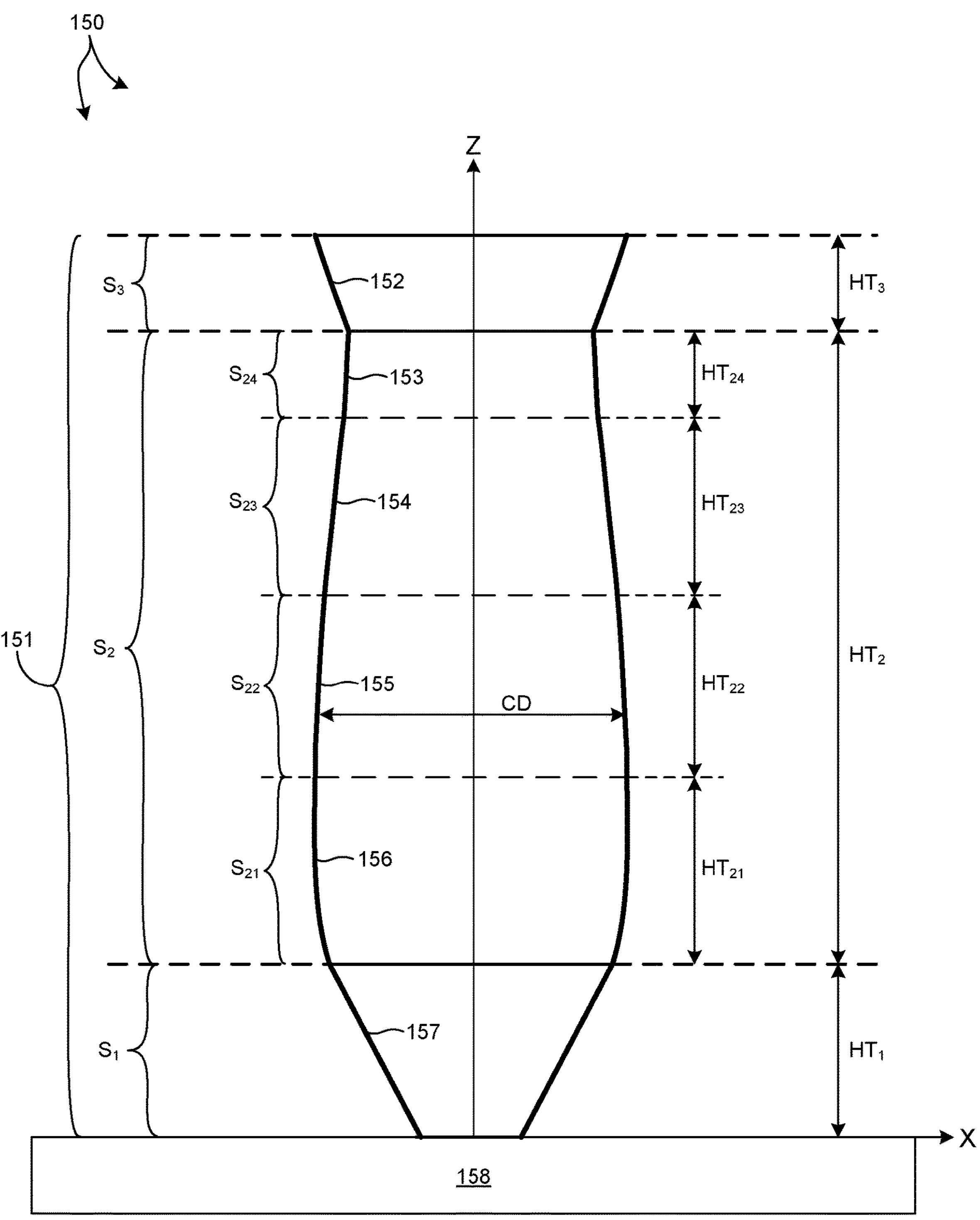
FIG. 2 is a diagram illustrative of a hole structure modelled by multiple sections of a re-useable, parametric model in one embodiment.

FIG. 2 is a diagram 150 illustrative of a hole structure 151 fabricated on a substrate 158. Diagram 150 depicts an x-axis aligned with the top surface of substrate 158 and a z-axis normal to the top surface of substrate 158. The hole structure 151 has a critical dimension (CD) value that varies as a function of height. In this example, the CD is the hole diameter measured in a direction parallel to the x-axis, and the height is the depth of the hole structure 151 measured in a direction parallel to the z-axis.

The profile of the hole structure 151, i.e., the CD as a function of height, is modelled by multiple sections of a re-useable, parametric model. In this example, the re-useable, parametric model includes three sections: $S_1$, $S_2$, and $S_3$. Section $S_1$, includes shape profile 157. Shape profile 157 is a straight line characterized by one parameter, the slope of the line. Section $S_3$, shape profile 152 is also a straight line characterized by the slope of the line. Section $S_2$, is a geometric section including four subsections: $S_{21}$, $S_{22}$, $S_{23}$, and $S_{24}$. Each subsection is characterized by a different shape profile parameterized by at least one shape parameter. Subsection $S_{21}$ includes shape profile 156, subsection $S_{22}$ includes shape profile 155, subsection $S_{23}$ includes shape profile 154, and subsection $S_{24}$ includes shape profile 153. Shape profiles 155 and 156 are polynomial curves each parameterized by more than one parameter. Shape profiles 154 and 153 are straight lines each characterized by one parameter.

Re-useable, parametric models including multiple geometric sections are very flexible and accurately capture real CD profiles. In some embodiments, geometric sections located near the top of a high aspect ratio structure include polynomials parameterized by one or two parameters, while geometric sections near the bottom of the structure are effectively modeled by polynomials parameterized by four or five parameters.

Although, FIG. 2 depicts a re-useable, parametric model including three different sections and four sub-sections, in general, any number of sections stacked along the direction of extent of the structure under measurement, e.g., the z-axis, may be contemplated within the scope of this patent document. In some embodiments, the number of sections and subsections and the parameterization of the shape profile associated with each section and subsection is defined by the user. In some examples, a user specifies the equation associated with each section and subsection. In some other embodiments, the number of sections and subsections is defined by the user and the parameterization of the shape profile associated with each section and subsection is defined automatically based on an expected CD profile. In some other embodiments, the number of sections and subsections and the parameterization of the shape profile associated with each section and subsection is specified automatically based on an expected CD profile.

In some embodiments, the height of each of the multiple geometric sections is defined in absolute terms by a height parameter. The height parameter value may be specified by a user or automatically based on an expected CD profile.

In another further aspect, the height of each of the multiple geometric sections is characterized by a height ratio defined with respect to at least one of the other multiple geometric sections. In this manner, the location of the junction point of shape profiles associated with adjacent geometric sections is specified in terms of the height of other sections. This allows the height of each section to be optimized during the measurement process with a relatively small number of floating variables. This results in a more accurate measurement of the actual CD profile with reduced computational effort.

As depicted in FIG. 2, the absolute height of section $S_1$ is $HT_1$, the absolute height of section $S_2$ is $HT_2$, and the absolute height of section $S_3$ is $HT_3$. However, rather than directly defining the height of each section as a fixed or independent variable, values associated with a set of height ratios associated with the model are specified. In one embodiment, the height ratios associated with the sections of the model depicted in FIG. 2 are illustrated by Equation (1).

$$HTRatio_1 = \frac{HT_1}{HT_1 + HT_2} \qquad (1)$$

$$HTRatio_2 = \frac{HT_2}{HT_2 + HT_3}$$

In this manner, the heights of adjacent sections described by different shape profiles are defined relative to one another. The heights of adjacent subsections are defined similarly. As depicted in FIG. 2, the absolute height of section $S_{21}$ is $HT_{21}$, the absolute height of section $S_{22}$ is $HT_{22}$, the absolute height of section $S_{23}$ is $HT_{23}$, and the absolute height of section $S_{24}$ is $HT_{24}$. In one embodiment, the height ratios associated with the sub-sections of the model depicted in FIG. 2 are illustrated by Equation (2).

$$HTRatio_{21} = \frac{HT_{21}}{HT_{21} + HT_{22}} \qquad (2)$$

$$HTRatio_{22} = \frac{HT_{22}}{HT_{22} + HT_{23}}$$

$$HTRatio_{23} = \frac{HT_{23}}{HT_{23} + HT_{24}}$$

Figure 3:
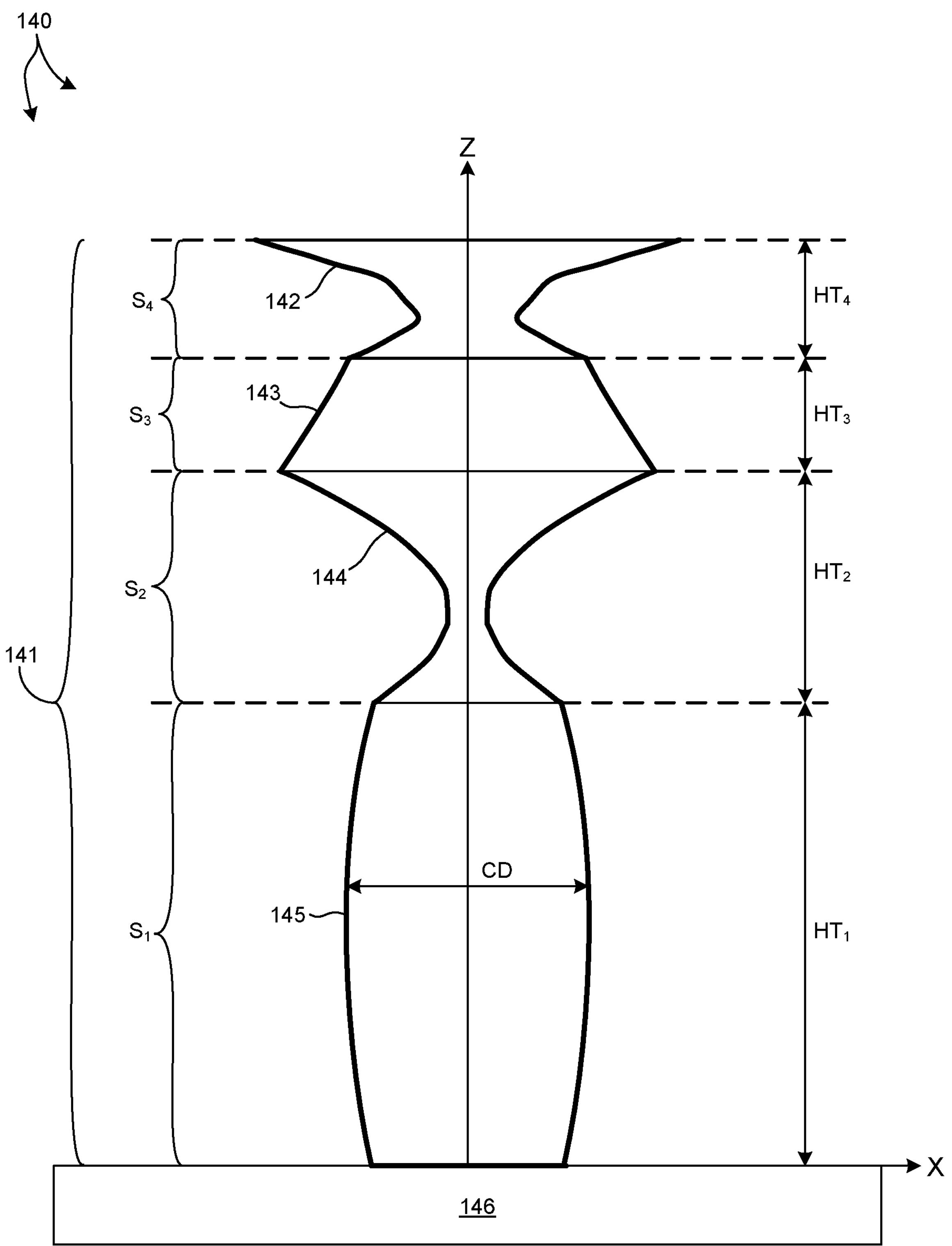
FIG. 3 is a diagram illustrative of a hole structure modelled by multiple sections of a re-useable, parametric model in another embodiment.

FIG. 3 is a diagram 140 illustrative of a hole structure 141 fabricated on a substrate 146. Diagram 140 depicts an x-axis aligned with the top surface of substrate 146 and a z-axis normal to the top surface of substrate 146. In this example, the CD is the hole diameter measured in a direction parallel to the x-axis, and the height is the depth of the hole structure 141 measured in a direction parallel to the z-axis.

The profile of the hole structure 141, i.e., the CD as a function of height, is modelled by four different geometric sections of a re-useable, parametric model. Section $S_1$, includes shape profile 145. Shape profile 145 is a polynomial characterized by multiple parameters. Section $S_2$, includes shape profile 144. Shape profile 144 is a polynomial characterized by multiple parameters. Section $S_3$, includes shape profile 143. Shape profile 143 is a line characterized by one parameter. Section $S_4$, includes shape profile 142. Shape profile 142 is a polynomial characterized by multiple parameters. As depicted in FIG. 3, the absolute height of section $S_1$ is $HT_1$, the absolute height of section $S_2$ is $HT_2$, the absolute height of section $S_3$ is $HT_3$, and the absolute height of section $S_4$ is $HT_4$. As illustrated by FIG. 3, hole structures having very complex CD profiles can be accurately modelled using multiple, geometric sections of a re-useable, parametric model as described herein.

Re-useable, parametric models including multiple geometric sections each characterized by a different shape profile are very flexible. In some examples, a model characterized by the same number of geometric sections and the same parameterization can accurately model CD profiles associated with different process specifications. In these examples, the model parameterization is the same, only the values of the parameters describing the shape profiles associated with each geometric section are changed to fit the model to the corresponding measurement data. Using the models described herein, the fitting results are more accurate overall and more robust to process variations compared to traditional geometric modeling techniques.

In some examples, a model characterized by the same number of geometric sections and the same parameterization can accurately model CD profiles associated with different etch process specifications.

Figure 4:
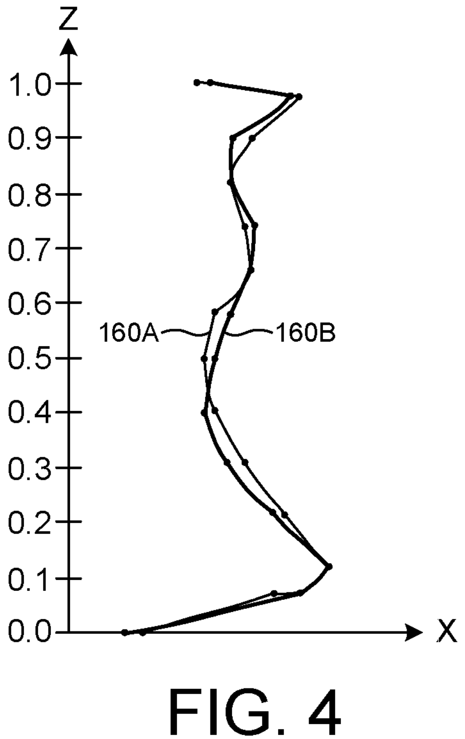
FIG. 4 illustrates a reference profile and a modelled profile associated with an instance of a high aspect ratio VNAND trench fabricated in accordance with a particular etch process specification.
Figure 5:
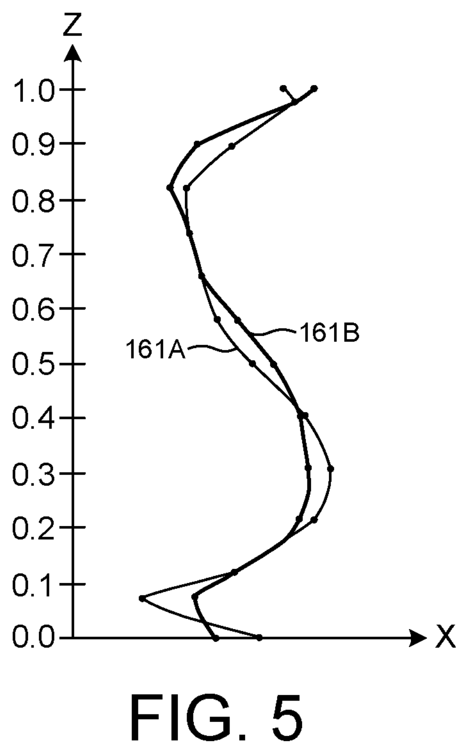
FIG. 5 illustrates a reference profile and a modelled profile associated with another instance of a high aspect ratio VNAND trench fabricated in accordance with the same etch process specification as FIG. 4.

FIGS. 4-5 illustrate different reference profiles and modelled profiles associated with high aspect ratio VNAND trenches fabricated in accordance with a particular etch process specification.

Figure 6:
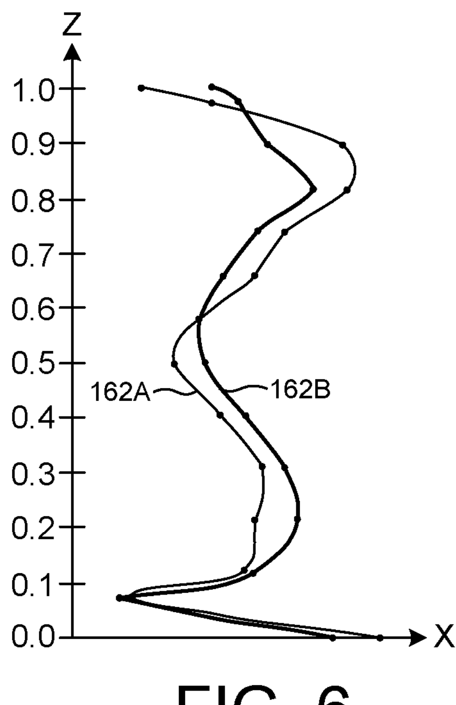
FIG. 6 illustrates a reference profile and a modelled profile associated with another instance of a high aspect ratio VNAND trench fabricated in accordance with an etch process specification different from FIG. 4.
Figure 7:
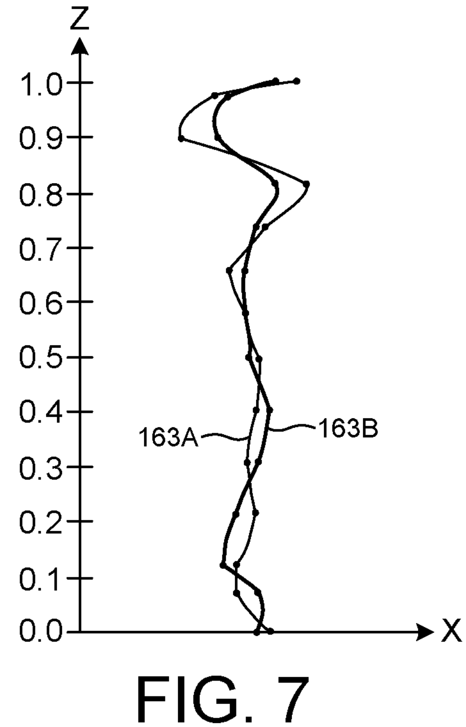
FIG. 7 illustrates a reference profile and a modelled profile associated with another instance of a high aspect ratio VNAND trench fabricated in accordance with the same etch process specification as FIG. 6.

FIGS. 6-7 illustrate different reference profiles and modelled profiles associated with high aspect ratio VNAND trenches fabricated in accordance with a particular etch process specification different from the specified etch process employed to fabricate the profiles depicted in FIGS. 4-5.

A model employing the same number of geometric sections and the same parameterization is employed to fit the reference profiles depicted in FIGS. 4-7. Plotline 160B of FIG. 4 is a reference profile associated with a VNAND trench structure under measurement. Plotline 160A of FIG. 4 is a corresponding CD profile modelled by a re-useable, parametric model after fitting of the measurement model to the measurement data associated with the structure under measurement. Plotline 161B is a reference profile associated with another instance of a VNAND trench structure fabricated with the same etch process specification as the VNAND trench structure depicted in FIG. 4. Plotline 161A is a corresponding CD profile modelled by the same re-useable, parametric model after fitting of the measurement model to the measurement data associated with the structure under measurement.

Plotline 162B is a reference profile associated with another instance of a VNAND trench structure fabricated in accordance with a different process specification than the VNAND structures illustrated by FIGS. 4-5. Plotline 162A is a corresponding CD profile modelled by the same re-useable, parametric model after fitting of the measurement model to the measurement data associated with the structure under measurement. Plotline 163B is a reference profile associated with another instance of a VNAND trench structure fabricated with the same etch process specification as the VNAND trench structure depicted in FIG. 6. Plotline 163A is a corresponding CD profile modelled by the same re-useable, parametric model after fitting of the measurement model to the measurement data associated with the profile under measurement. As depicted in FIGS. 4-7, a model characterized by the same number of geometric sections and the same parameterization accurately models CD profiles associated with multiple instances of a VNAND structure fabricated under different etch process specifications.

In another further aspect, the parameterization and initial values of the shape profile associated with each section of a re-useable, parametric model is determined by a trained library selection function based on a reference shape profile associated with a structure under measurement.

In some embodiments, a trained library selection function is a machine learning based model that receives a reference profile associated with a structure under measurement. The reference profile is an expected profile of the structure under measurement derived from a simulation of the fabrication process, user experience, a reference measurement performed by a trusted metrology system, etc. The trained library selection function specifies the shape profile parameterization, i.e., the parameterized mathematical description of the shape profile, associated with each section of the re-useable, parametric model, and initial values of each of the parameters associated with each of each shape profiles that best match the reference profile. In this manner, the computational effort associated with regression of the shape profile parameters to best match actual measurement data with measurement data predicted by the measurement model is minimized.

The trained library selection function is trained based on a Design Of Experiments (DOE) set of reference profiles and a library of DOE shape profiles synthetically generated over a range of parameterizations and parameter values. The model training minimized the differences between DOE reference profiles and specific DOE shape profile parameterizations and associated parameter values. The trained library selection function is able to specify the shape profile parameterization and parameter values that best fit the reference profile provided as input to the trained library selection function.

In another further aspect, the fitting of a measurement model to an amount of measurement data associated with a structure under measurement involves a regression on the values of the set of independent parameters of the re-useable, parametric model, including the shape parameters associated with the shape profile associated with each section of the re-useable, parametric model. The fitting may involve searching through a library of different shape profile parameterizations to identify shape profile parameterizations and associated parameter values that best fit the measurement model predictions to the actual measurement data. In preferred embodiments, this process is accelerated by employing a trained library selection function to select the shape profile parameterizations and initial values associated with each section of the re-useable, parametric model. In this manner, model regression is limited to refining model parameter values to achieve the best fit.

In general, measurement model regression is initiated with seed values of the shape parameters associated with the shape profiles associated with each section of the re-useable, parametric model. The seed values may be determined randomly, directly by a user based on experience, directly by a user based on a fit of each shape profile to a reference using off-line computational tools operated by a user, or using a trained library selection function.

In another aspect, a set of re-useable, parametric sub-structure models are employed to accurately model the geometry of next generation semiconductor devices based on nanowire fabrication processes. In some examples, these primitive nanowire building blocks allow a user to build measurement models that represent actual nanowire geometries with high accuracy and allow all possible degrees of freedom. In some examples, metrology systems employ these models to perform model based measurements of geometric parameters, material characteristics, etc., associated with different nanowire fabrication processes.

In some examples, nanowire based semiconductor devices are also known as gate all around devices. In these devices, the semiconductor channel is the nanowire. The nanowire is wrapped all around by a series of materials that form the gate of the device. The wrapper materials include materials such as silicon dioxide, hafnium oxide, titanium nitride, tantalum nitride, etc. The wrapper materials are deposited on the nanowire using an atomic layer deposition process forming a wrapping gate all around the nanowire channel.

Figure 8:
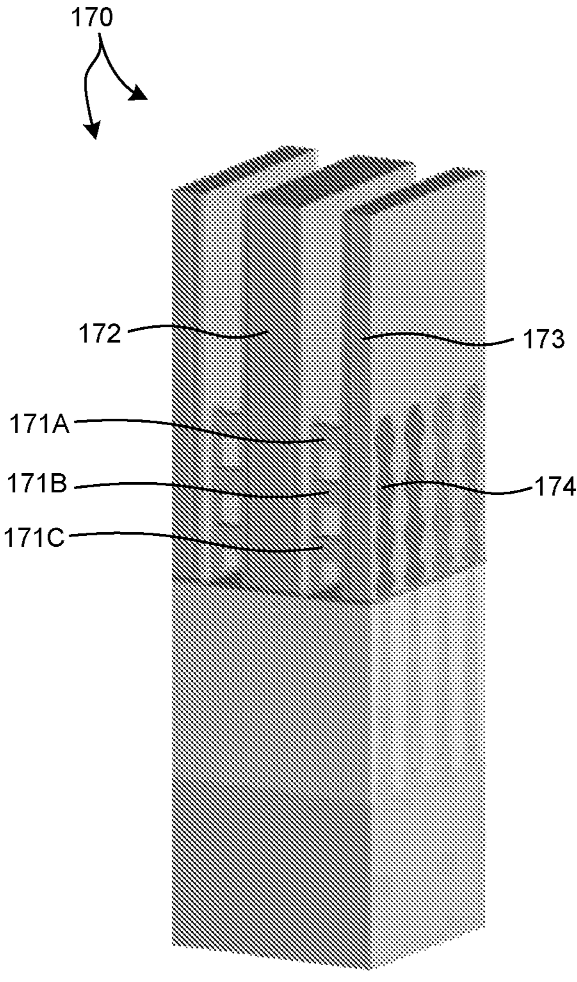
FIG. 8 is a diagram illustrative of a nanowire based semiconductor structure in one embodiment.

FIG. 8 depicts a nanowire based semiconductor structure 170. Structure 170 includes nanowires 171A-C, source/drain structures 172 and 173, and dielectric material 174. As illustrated in FIG. 8, nanowires 171A-C extend unsupported between source/drain structures 172 and 173. As a result, there are voids between adjacent nanowires.

The shape of a nanowire or nanosheet affects device performance significantly. Furthermore, the shape of a nanowire or nanosheet can change from one process step to another. In one example, sacrificial Silicon Germanium sheets are removed at the nanosheet release step. However, the underlying Silicon nanosheets are affected by various etch recipes. Part of the Silicon is consumed by the Silicon Germanium removal process, and as a result, the height of the Silicon nanosheets is also reduced during the release step. This can lead to height non-uniformity among Silicon nanosheets.

The set of re-useable, parametric sub-structure models described herein are flexible and easily customized to adapt to the expected shapes of next generation semiconductor devices. Model building is simplified, less time consuming, less error prone, and more accurate. By way of non-limiting example, FIGS. 9-13 depict several different primitive nanowire building blocks.

Figure 9:
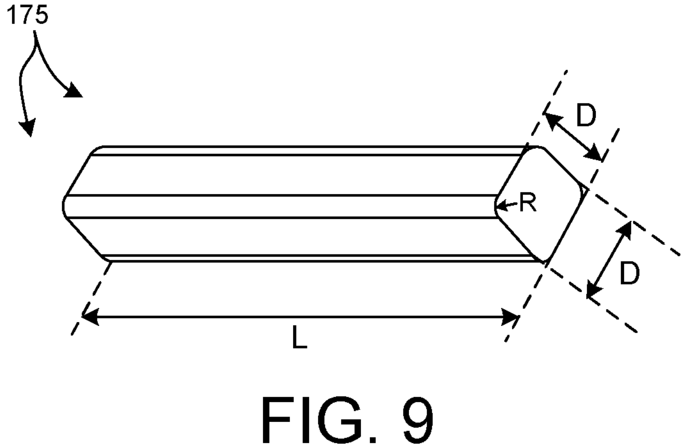
FIG. 9 is a diagram illustrative of a rounded square primitive nanowire building block in one embodiment.

FIG. 9 depicts a rounded square primitive nanowire building block 175. Rounded square nanowire building block 175 is parameterized by a length, L, a cross-sectional width, D, radius, R, at the corners of the square cross-section, an orientation angle in a plane parallel with the surface of the wafer substrate, and one or more material parameters. The orientation angle determines the orientation of the rounded square nanowire 175 in a plane parallel with the surface of the wafer substrate. In this example, a user defines the values of the aforementioned parameters to fully define the nanowire.

Figure 10:
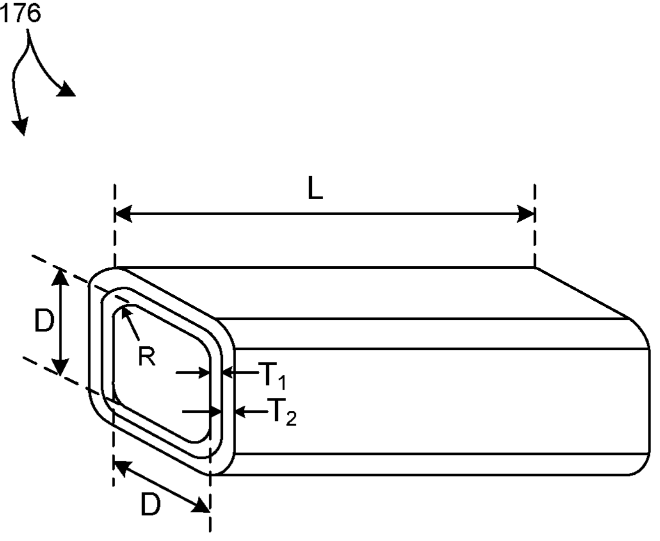
FIG. 10 is a diagram illustrative of a re-usable, parametric sub-structure model including two conformal layers wrapped around rounded square nanowire building block in one embodiment.

FIG. 10 depicts a re-usable, parametric sub-structure model 176 representing two conformal layers wrapped around rounded square nanowire building block 175. As depicted in FIG. 10, the independent parameters that define the shape of the model include the thicknesses of each conformal layer, $T_1$ and $T_2$, in addition to the parameters characterizing the base structure as described hereinbefore.

Figure 11:
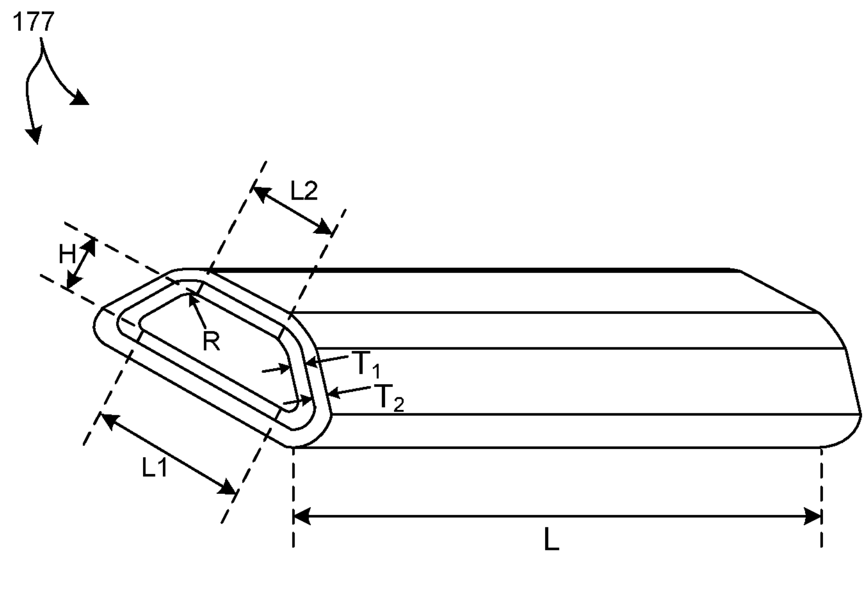
FIG. 11 is a diagram illustrative of a rounded trapezoid nanosheet building block in one embodiment.

FIG. 11 depicts a rounded trapezoid nanosheet building block 177. Rounded trapezoid nanosheet building block 177 is parameterized by length, L, cross-sectional lengths, $L_1$ and $L_2$, cross-sectional height, H, radius, R, at the corners of the trapazoidal cross-section, an orientation angle in a plane parallel with the surface of the wafer substrate, and one or more material parameters. The orientation angle determines the orientation of the rounded trapezoid nanosheet 177 in a plane parallel with the surface of the wafer substrate. In this example, a user defines the values of the aforementioned parameters to fully define the nanosheet.

Figure 12:
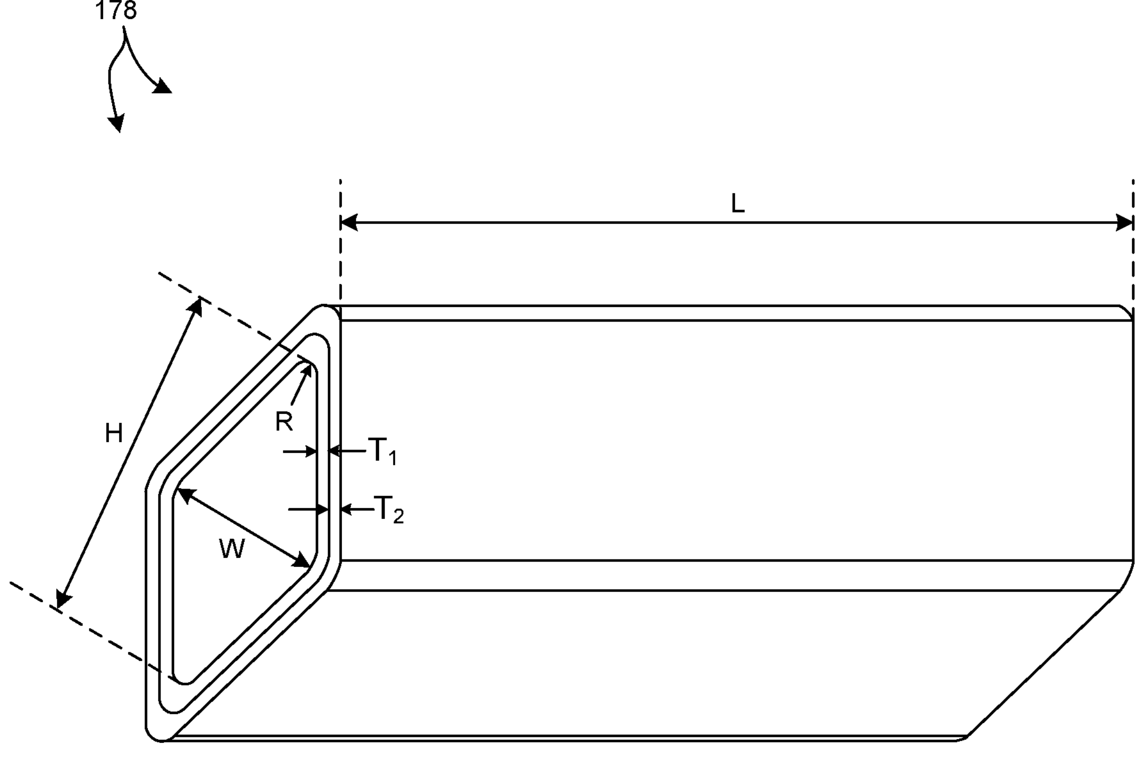
FIG. 12 is a diagram illustrative of a rounded diamond nanowire building block in one embodiment.

FIG. 12 depicts a rounded diamond nanowire building block 178. Rounded diamond nanowire building block 178 is parameterized by length, L, cross-sectional width, W, cross-sectional height, H, radius, R, at the corners of the diamond shaped cross-section, an orientation angle in a plane parallel with the surface of the wafer substrate, and one or more material parameters. The orientation angle determines the orientation of the rounded diamond nanowire 178 in a plane parallel with the surface of the wafer substrate. In this example, a user defines the values of the aforementioned parameters to fully define the nanowire.

Figure 13:
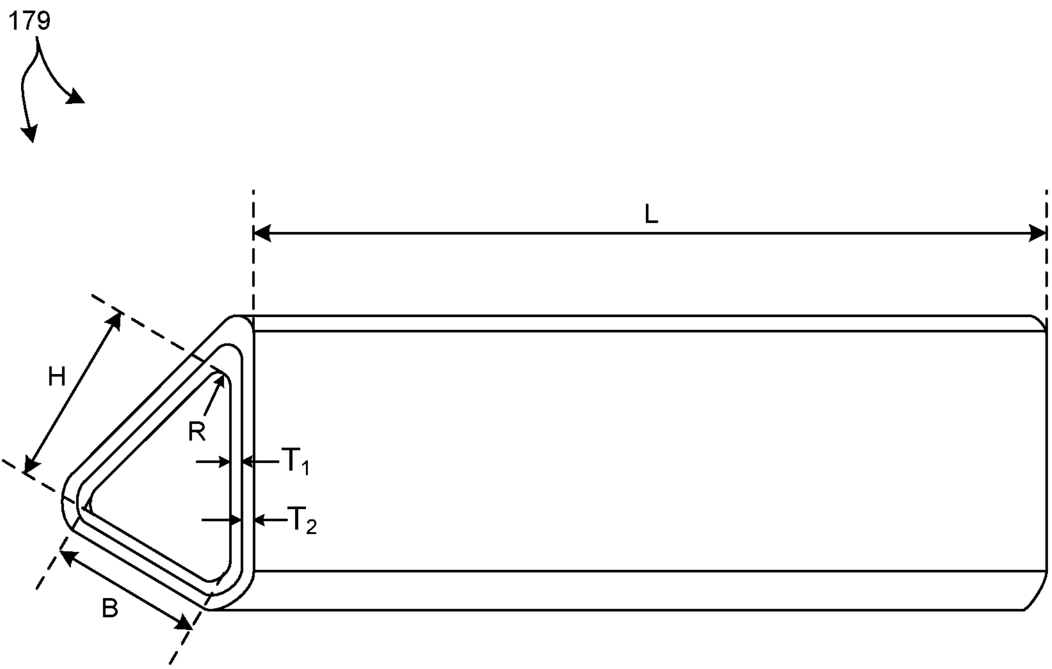
FIG. 13 is a diagram illustrative of a rounded triangle nanowire building block in one embodiment.

FIG. 13 depicts a rounded triangle nanowire building block 179. Rounded triangle nanowire building block 179 is parameterized by length, L, cross-sectional base width, B, cross-sectional height, H, radius, R, at the corners of the triangle shaped cross-section, an orientation angle in a plane parallel with the surface of the wafer substrate, and one or more material parameters. The orientation angle determines the orientation of the rounded triangle nanowire 179 in a plane parallel with the surface of the wafer substrate. In this example, a user defines the values of the aforementioned parameters to fully define the nanowire.

In general, each nanowire block may be oriented such that the central axis of the nanowire, e.g., axis parallel to the length dimension, L, is parallel to the surface of the wafer substrate (i.e., a lateral nanowire). This is analogous to the orientation of nanowires 171A-C depicted in FIG. 8. In some other examples, a nanowire may be oriented such that the central axis of the nanowire is perpendicular to the surface of the wafer substrate (i.e., a vertical nanowire).

The shape of the nanowire will affect the device performance significantly. Depending on the application, one nanowire shape could be desired over another shape. Therefore, the nanowire building blocks should be flexible and customizable to account for all expected shapes.

In general, a user interacts with a graphical user interface of a nanowire structural model building module (e.g., structural model building module 131 of model building and analysis engine 130 or structural model building module 351 of model building and analysis engine 350) to select a desired primitive nanowire building block and define the specific shape by entering the appropriate values of the independent parameters.

As depicted in FIGS. 9-13, a single re-useable, parametric sub-structure model that is fully defined by only a few independent parameters replaces a model that includes many geometric primitives and dozens of constraints and shape parameter values. A structural model of the nanowires depicted in FIGS. 9-13 would require the definition of many existing primitive building blocks (e.g., square frusta) and their interrelationships and constraints among each of the building blocks to model a similar nanowire structure. Thus, it is clear the difficulty associated with building a complex nanowire device structure using existing primitive building blocks.

In a nanowire semiconductor fabrication process, alternating layers of materials are deposited, for example, in the gate depicted in FIG. 8. In one example, alternating layers of silicon and silicon germanium are deposited. After the dummy gate material is removed, e.g., polysilicon, the nanowires are released. Nanowire release is a highly selective etch process where, for example, the silicon germanium layers are exclusively etched, leaving behind the silicon nanowires, e.g., nanowires 171A-C depicted in FIG. 8. After nanowire release, a series of ultra-thin materials are deposited on the gate prior to the deposition of the metal. These materials are typically very thin and are intended to wrap all around the nanowire. In one example, a 10 angstrom thick layer of silicon dioxide is deposited all around the nanowire. This silicon dioxide wrapper is itself wrapped by a high-K material wrapper. The high-K material wrapper is subsequently wrapped by a 10 angstrom thick titanium nitride wrapper, then a barrier metal tantalum nitride wrapper of 5-10 angstroms, then another titanium nitride wrapper, then a titanium aluminum carbide wrapper, and then a titanium nitride wrapper. The depositions are formed by atomic layer deposition (ALD). PMOS and NMOS require different high-k metal gate (HKMG) process flows, which can change the number of critical layers. The HKMG process is at the end of the front end of the line (FEOL) loop of the CMOS device. The number of wrappers around the gate as well as their thicknesses can vary depending on the technology node or the device type, e.g., N or P.

In some embodiments, the re-useable, parametric sub-structure models are structure-specific. FIGS. 10-13 depict a re-usable, parametric sub-structure models representing two conformal layers wrapped around a nanowire. As depicted in FIGS. 10-13, the independent parameters that define the shape of the model include the thicknesses of each conformal layer, $T_1$ and $T_2$, in addition to the parameters characterizing the base structure as described hereinbefore. Optionally, material parameters associated each of the layers may be defined as independent variables that can be defined by a user.

A user of the model building tool only needs to enter the values of these parameters to fully define the geometry of these re-useable, parametric sub-structure models, representative of a wrapped nanowire. All of the other variables associated with the model shape and internal constraints are pre-defined within the model, and no further input is required to fully define the shape of the models.

In general, the shape of the underlying nanowire defines the shape of the wrapper, e.g., rounded square, rounded trapezoid, rounded diamond, rounded triangle, etc. By default, when the user adds a wrapper to the nanowire the wrapper conforms to the nanowire shape. A wrapper definition includes a foundation building block, i.e., a building block upon which the wrapper conforms. The foundation building block associated with a wrapper is exclusively a nanowire or a prior wrapper.

In the embodiments depicted in FIGS. 10-13, each wrapper is conformal with a uniform thickness all the way around and along the underlying foundation block (e.g., underlying nanowire or prior wrapper).

However, the high-K metal gate (HKMG) process is non-uniform. The all-around wrappers have different thicknesses depending on orientation. For example, the thickness of a given high-K wrapper layer is expected to be greater on the top side of the nanowire than the bottom side of the nanowire.

In a further aspect, a composite nanowire building block includes a non-uniform thickness wrapper. In these examples, different thicknesses are specified at the top and bottom of the nanowire model, and the differences in thickness above and below the nanowire are interpolated at orientations between the top and bottom of the nanowire.

Figure 14:
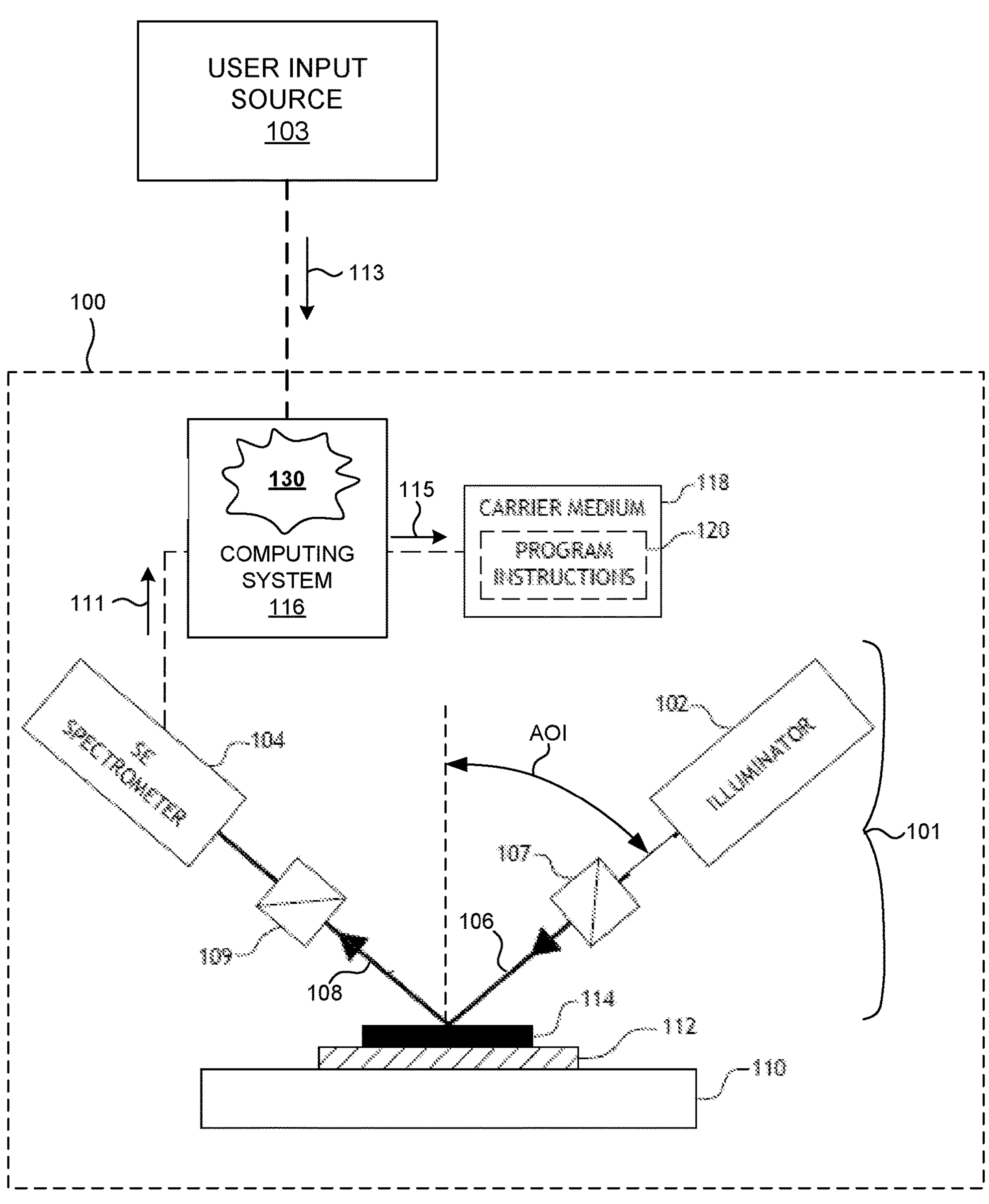
FIG. 14 is a diagram illustrative of an embodiment of a spectroscopic ellipsometry system for measuring characteristics of a semiconductor wafer based on measurement models including re-useable, parametric structure models as described herein.

FIG. 14 illustrates a system 100 for measuring characteristics of a semiconductor wafer. As shown in FIG. 14, system 100 may be used to perform spectroscopic ellipsometry measurements of one or more structures 114 of a semiconductor wafer 112 disposed on a wafer positioning system 110. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 150-4500 nm) to the structure 114 disposed on the surface of the semiconductor wafer 112. In turn, the spectrometer 104 is configured to receive light from the surface of the semiconductor wafer 112. It is further noted that the light emerging from the illuminator 102 is polarized using a polarization state generator 107 to produce a polarized illumination beam 106. The radiation reflected by the structure 114 disposed on the wafer 112 is passed through a polarization state analyzer 109 and to the spectrometer 104. The radiation received by a detector of spectrometer 104 in the collection beam 108 is analyzed with regard to polarization state, allowing for spectral analysis of radiation passed by the analyzer. These spectra 111 are passed to the computing system 116 for analysis of the structure 114.

In a further embodiment, the metrology system 100 is a measurement system 100 that includes one or more computing systems 116 configured to execute model building and analysis tool 130 in accordance with the description provided herein. In the preferred embodiment, model building and analysis tool 130 is a set of program instructions 120 stored on a carrier medium 118. The program instructions 120 stored on the carrier medium 118 are read and executed by computing system 116 to realize model building and analysis functionality as described herein. The one or more computing systems 116 may be communicatively coupled to the spectrometer 104. In one aspect, the one or more computing systems 116 are configured to receive measurement data 111 associated with a measurement (e.g., critical dimension, film thickness, composition, process, etc.) of the structure 114 of specimen 112. In one example, the measurement data 111 includes an indication of the measured spectral response (e.g., measured intensity as a function of wavelength) of the specimen by measurement system 100 based on the one or more sampling processes from the spectrometer 104. In some embodiments, the one or more computing systems 116 are further configured to determine specimen parameter values of structure 114 from measurement data 111.

In some examples, metrology based on optical scatterometry involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured optical intensities and modeled results.

In a further aspect, computing system 116 is configured to generate a structural model (e.g., geometric model, material model, or combined geometric and material model) of a measured structure of a specimen, generate an optical response model that includes at least one geometric parameter from the structural model, and resolve at least one specimen parameter value by performing a fitting analysis of optical measurement data with the optical response model. The analysis engine is used to compare the simulated optical response signals with measured data thereby allowing the determination of geometric as well as material properties of the sample. In the embodiment depicted in FIG. 14, computing system 116 is configured as a model building and analysis engine 130 configured to implement model building and analysis functionality as described herein.

Figure 15:
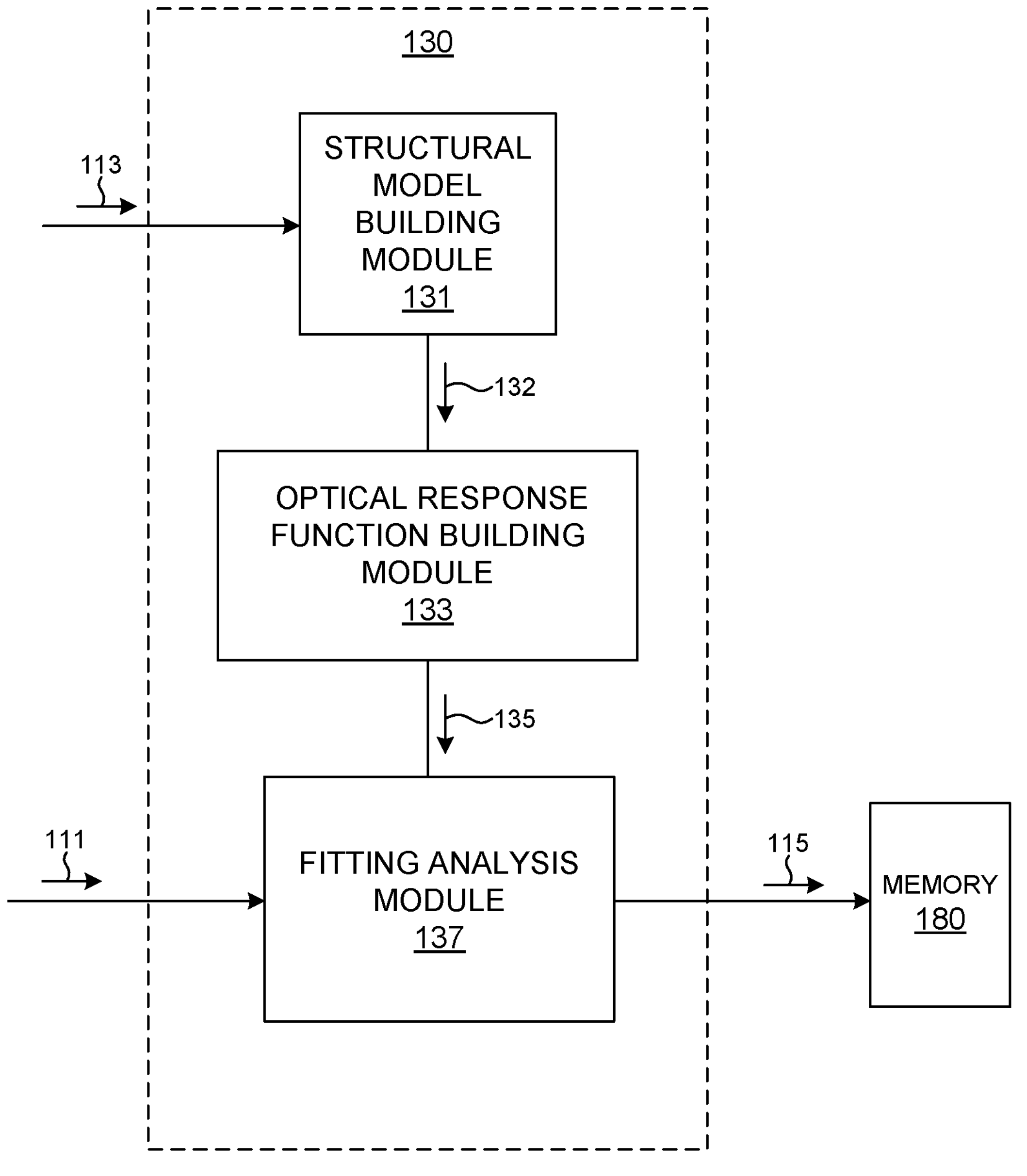
FIG. 15 is a diagram illustrative of an embodiment of a model building and analysis engine configured to generate re-useable, parametric structure models of semiconductor structures as described herein.

FIG. 15 is a diagram illustrative of an exemplary model building and analysis engine 130 implemented by computing system 116. As depicted in FIG. 15, model building and analysis engine 130 includes a structural model building module 131 that generates a structural model 132 of a measured nanowire based semiconductor structure disposed on a specimen based in part on user input 113. In some embodiments, structural model 132 also includes material properties of the specimen. The structural model 132 is received as input to optical response function building module 133. Optical response function building module 133 generates an optical response function model 135 based at least in part on the structural model 132.

Optical response function model 135 is received as input to fitting analysis module 137. The fitting analysis module 137 compares the modeled optical response with the corresponding measured data 111 to determine geometric as well as material properties of the specimen.

In some examples, fitting analysis module 137 resolves at least one specimen parameter value by performing a fitting analysis on optical measurement data 111 with the optical response model 135.

The fitting of optical metrology data is advantageous for any type of optical metrology technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing light interaction with the specimen are used.

In general, computing system 116 is configured to access model parameters in real-time, employing Real Time Critical Dimensioning (RTCD), or it may access libraries of pre-computed models for determining a value of at least one specimen parameter value associated with the specimen 114. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In addition, in some embodiments, the one or more computing systems 116 are further configured to receive user input 113 from a user input source 103 such as a graphical user interface, keyboard, etc. The one or more computer systems are further configured to configure re-useable, parametric sub-structure models as described herein to generate a structural model of the semiconductor structure under measurement (e.g., structural model 132).

In some embodiments, measurement system 100 is further configured to store one or more re-useable, parametric sub-structure models 115 in a memory (e.g., memory 180 depicted in FIG. 15).

Figure 16:
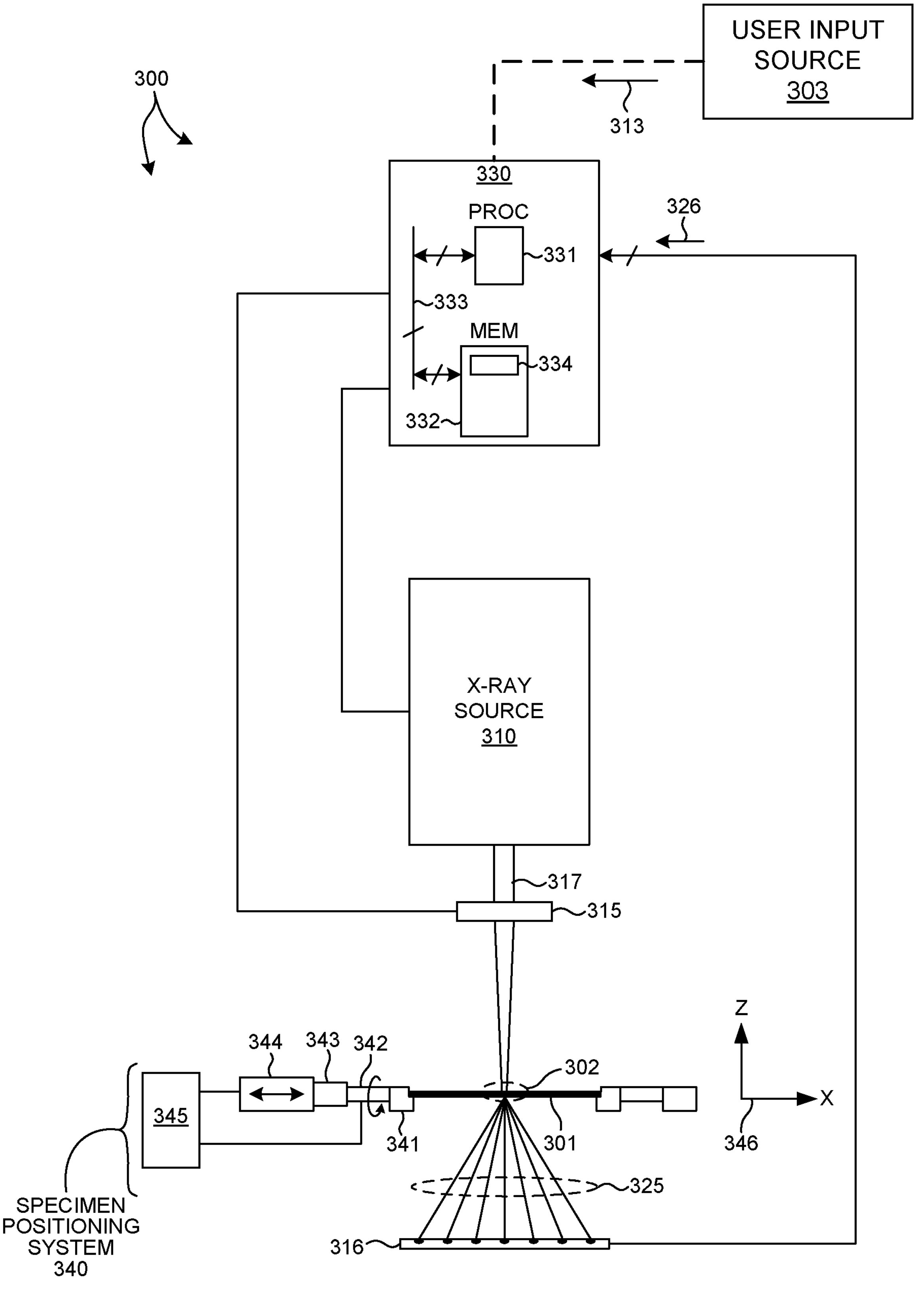
FIG. 16 is a diagram illustrative of an embodiment of an x-ray based metrology system for measuring characteristics of a semiconductor wafer based on measurement models including re-useable, parametric structure models of semiconductor structures as described herein.

FIG. 16 illustrates an embodiment of an x-ray metrology tool 300 for measuring characteristics of a specimen in accordance with the exemplary methods presented herein. As shown in FIG. 16, the system 300 may be used to perform x-ray scatterometry measurements over an inspection area 302 of a specimen 301 disposed on a specimen positioning system 340. In some embodiments, the inspection area 302 has a spot size of five hundred micrometers or less. In some embodiments, the inspection area 302 has a spot size of fifty micrometers or less.

In the depicted embodiment, metrology tool 300 includes an x-ray illumination source 310 configured to generate x-ray radiation suitable for x-ray scatterometry measurements. In some embodiments, the x-ray illumination system 310 is configured to generate wavelengths between 0.01 nanometers and 1 nanometer. X-ray illumination source 310 produces an x-ray beam 317 incident on inspection area 302 of specimen 301.

In general, any suitable high-brightness x-ray illumination source capable of generating high brightness x-rays at flux levels sufficient to enable high-throughput metrology may be contemplated to supply x-ray illumination for x-ray scatterometry measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, and an inverse Compton source may be employed as x-ray source 310. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths. In some embodiments, an x-ray source includes an electron beam source configured to bombard solid or liquid targets to stimulate x-ray radiation.

In one embodiment, the incident x-ray beam 317 is at the Indium kα line of 24.2 keV. The x-ray beam is collimated down to less than one milliradian divergence using multilayer x-ray optics for x-ray scatterometry measurements.

In some embodiments, the profile of the incident x-ray beam is controlled by one or more apertures, slits, or a combination thereof. In a further embodiment, the apertures, slits, or both, are configured to rotate in coordination with the orientation of the specimen to optimize the profile of the incident beam for each angle of incidence, azimuth angle, or both.

As depicted in FIG. 16, x-ray optics 315 shape and direct incident x-ray beam 317 to specimen 301. In some examples, x-ray optics 315 include an x-ray monochromator to monochromatize the x-ray beam that is incident on the specimen 301. In one example, a crystal monochromator such as a Loxley-Tanner-Bowen monochromator is employed to monochromatize the beam of x-ray radiation. In some examples, x-ray optics 315 collimate or focus the x-ray beam 317 onto inspection area 302 of specimen 301 to less than 1 milliradian divergence using multilayer x-ray optics. In some embodiments, x-ray optics 315 includes one or more x-ray collimating mirrors, x-ray apertures, x-ray beam stops, refractive x-ray optics, diffractive optics such as zone plates, specular x-ray optics such as grazing incidence ellipsoidal mirrors, polycapillary optics such as hollow capillary x-ray waveguides, multilayer optics, or systems, or any combination thereof. Further details are described in U.S. Patent Publication No. 2015/0110249, the content of which is incorporated herein by reference it its entirety.

In general, the focal plane of the illumination optics system is optimized for each measurement application. In this manner, system 300 is configured to locate the focal plane at various depths within the specimen depending on the measurement application.

X-ray detector 316 collects x-ray radiation 325 scattered from specimen 301 and generates an output signal 326 indicative of properties of specimen 301 that are sensitive to the incident x-ray radiation in accordance with an x-ray scatterometry measurement modality. In some embodiments, scattered x-rays 325 are collected by x-ray detector 316 while specimen positioning system 340 locates and orients specimen 301 to produce angularly resolved scattered x-rays.

In some embodiments, an x-ray scatterometry system includes one or more photon counting detectors with high dynamic range (e.g., greater than $10^5$) and thick, highly absorptive crystal substrates that absorb the direct beam (i.e., zero order beam) without damage and with minimal parasitic backscattering. In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 316 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 330 via output signals 326 for further processing and storage.

In a further aspect, x-ray scatterometry system 300 is employed to determine properties of a specimen (e.g., structural parameter values) based on one or more measured intensities. As depicted in FIG. 16, metrology system 300 includes a computing system 330 employed to acquire signals 326 generated by detector 316 and determine properties of the specimen based at least in part on the acquired signals.

In an x-ray scatterometry measurement, a structure (e.g., a high aspect ratio, vertically manufactured structure) diffracts a collimated or focused X-ray beam into diffraction orders. Each diffraction order travels in a particular, predictable direction. The angular spacing of the diffraction orders is inversely proportional to the lattice constant of the specimen divided by the wavelength. The diffraction orders are detected by a detector array placed at some distance from the wafer. Each pixel of the detector outputs a signal that indicates the number of photons that hit the pixel.

The intensities of diffraction orders are of the form $I(m,n,\theta,\phi,\lambda)$, where $\{m,n\}$ are integer indices of diffraction orders, $\{\theta,\phi\}$ are elevation and azimuth angles of the incident beam (i.e., polar coordinates of the incident chief ray with respect to a coordinate system that is fixed to the wafer), and $\lambda$ is the wavelength of the incident X-ray.

Several noise sources perturb the illumination light as it exits the illumination and propagates toward the specimen. Exemplary disturbances include electron beam current fluctuation, temperature induced optic drift, etc. The perturbed incident flux is denoted as $F_0(1+n_1)$.

The target scatters the incident radiation in a manner that depends on the azimuth and elevation angles of the incident beam. The efficiency of light scattering into orders (m,n) can be defined as $S_{mn}(\theta,\phi)$. As the diffracted light propagates from the specimen to the detector, the beam passes through other scattering media that affect all orders similarly with some variation $(1+n_2)$ and parasitic noise $(n_3)$. In this manner the total intensity $I_{mn}$ of each order measured in a time, t, can be expressed by equation (3).

$$I_{mm} = S_{mm}(\theta, \phi)(1+n_2)(1+n_1)F_0 t + n_3 \quad (3)$$

In some embodiments, it is desirable to perform measurements at different orientations described by rotations about the x and y axes indicated by coordinate system 346 depicted in FIG. 16. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy. For example, in a normal orientation, x-ray scatterometry is able to resolve the critical dimension of a feature, but is largely insensitive to sidewall angle and height of a feature. However, by collecting measurement data over a broad range of out of plane angular positions, the sidewall angle and height of a feature can be resolved.

As illustrated in FIG. 16, metrology tool 300 includes a specimen positioning system 340 configured to both align specimen 301 and orient specimen 301 over a large range of out of plane angular orientations with respect the scatterometer. In other words, specimen positioning system 340 is configured to rotate specimen 301 over a large angular range about one or more axes of rotation aligned in-plane with the surface of specimen 301. In some embodiments, specimen positioning system is configured to rotate specimen 301 within a range of at least 120 degrees about one or more axes of rotation aligned in-plane with the surface of specimen 301. In this manner, angle resolved measurements of specimen 301 are collected by metrology system 300 over any number of locations on the surface of specimen 301. In one example, computing system 330 communicates command signals to motion controller 345 of specimen positioning system 340 that indicate the desired position of specimen 301. In response, motion controller 345 generates command signals to the various actuators of specimen positioning system 340 to achieve the desired positioning of specimen 301.

By way of non-limiting example, as illustrated in FIG. 16, specimen positioning system 340 includes an edge grip chuck 341 to fixedly attach specimen 301 to specimen positioning system 340. A rotational actuator 342 is configured to rotate edge grip chuck 341 and the attached specimen 301 with respect to a perimeter frame 343. In the depicted embodiment, rotational actuator 342 is configured to rotate specimen 301 about the x-axis of the coordinate system 346 illustrated in FIG. 16. As depicted in FIG. 16, a rotation of specimen 301 about the z-axis is an in plane rotation of specimen 301. Rotations about the x-axis and the y-axis (not shown) are out of plane rotations of specimen 301 that effectively tilt the surface of the specimen with respect to the metrology elements of metrology system 300. Although it is not illustrated, a second rotational actuator is configured to rotate specimen 301 about the y-axis. A linear actuator 344 is configured to translate perimeter frame 343 in the x-direction. Another linear actuator (not shown) is configured to translate perimeter frame 343 in the y-direction. In this manner, every location on the surface of specimen 301 is available for measurement over a range of out of plane angular positions. For example, in one embodiment, a location of specimen 301 is measured over several angular increments within a range of −45 degrees to +45 degrees with respect to the normal orientation of specimen 301.

In general, specimen positioning system 340 may include any suitable combination of mechanical elements to achieve the desired linear and angular positioning performance, including, but not limited to goniometer stages, hexapod stages, angular stages, and linear stages.

In some examples, metrology based on x-ray scatterometry involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In a further aspect, computing system 330 is configured to generate a structural model (e.g., geometric model, material model, or combined geometric and material model) of a measured structure of a specimen, generate a x-ray scatterometry response model that includes at least one geometric parameter from the structural model, and resolve at least one specimen parameter value by performing a fitting analysis of x-ray scatterometry measurement data with the x-ray scatterometry response model. The analysis engine is used to compare the simulated x-ray scatterometry signals with measured data thereby allowing the determination of geometric as well as material properties such as electron density of the sample. In the embodiment depicted in FIG. 16, computing system 330 is configured as a model building and analysis engine 350 configured to implement model building and analysis functionality as described herein.

Figure 17:
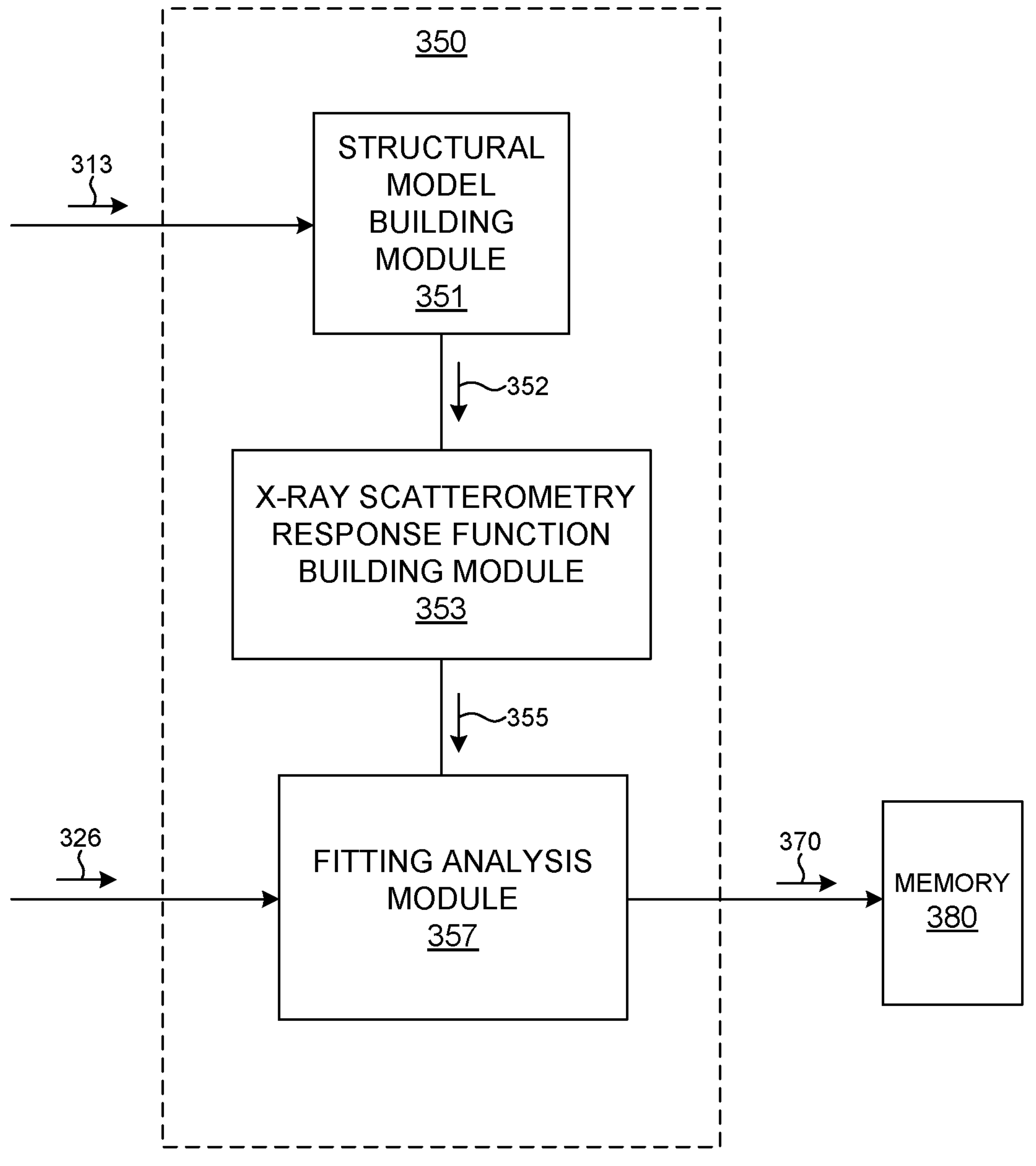
FIG. 17 is a diagram illustrative of another embodiment of a model building and analysis engine configured to generate re-useable, parametric structure models of semiconductor structures as described herein.

FIG. 17 is a diagram illustrative of an exemplary model building and analysis engine 350 implemented by computing system 330. As depicted in FIG. 17, model building and analysis engine 350 includes a structural model building module 351 that generates a structural model 352 of a measured semiconductor structure disposed on a specimen based in part on user input 313 received from a user input source 303 (e.g., a graphical user interface, keyboard, etc.). In some embodiments, structural model 352 also includes material properties of the specimen. The structural model 352 is received as input to x-ray scatterometry response function building module 353. X-ray scatterometry response function building module 353 generates a x-ray scatterometry response function model 355 based at least in part on the structural model 352. In some examples, the x-ray scatterometry response function model 355 is based on x-ray form factors, $$F(\vec{q}) = \int \rho(\vec{r}) e^{-i\vec{q}\cdot\vec{r}} d\vec{r} \tag{4}$$

where F is the form factor, q is the scattering vector, and ρ(r) is the electron density of the specimen in spherical coordinates. The x-ray scattering intensity is then given by $$I(\vec{q}) = F * F. \tag{5}$$

X-ray scatterometry response function model 355 is received as input to fitting analysis module 357. The fitting analysis module 357 compares the modeled x-ray scatterometry response with the corresponding measured data 326 to determine geometric as well as material properties of the specimen.

In some examples, the fitting of modeled data to experimental data is achieved by minimizing a chi-squared value. For example, for x-ray scatterometry measurements, a chi-squared value can be defined as $$\chi^2_{SAXS} = \frac{1}{N_{SAXS}} \sum_j^{N_{SAXS}} \frac{\left(s_j^{SAXS\ model}(v_1, \ldots, v_L) - s_j^{SAXS\ experiment}\right)^2}{\sigma^2_{SAXS,j}} \tag{6}$$

Where, $$s_j^{SAXS\ experiment}$$

is the measured x-ray scatterometry signals 326 in the "channel" j, where the index j describes a set of system parameters such as diffraction order, energy, angular coordinate, etc.

$$s_j^{SAXS\ model}(V_1, \ldots, V_L)$$

is the modeled x-ray scatterometry signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (6) assumes that the uncertainties associated with different channels are uncorrelated. In examples where the uncertainties associated with the different channels are correlated, a covariance between the uncertainties, can be calculated. In these examples a chi-squared value for x-ray scatterometry measurements can be expressed as $$\chi^2_{SAXS} = \frac{1}{N_{SAXS}} \left(\vec{S}_j^{SAXS.\,model}(v_1, \ldots, v_M) - \vec{S}_j^{SAXS.\,experiment}\right)^T V_{SAXS}^{-1} \left(\vec{S}_j^{SAXS.\,model}(v_1, \ldots, v_M) - \vec{S}_j^{SAXS.\,experiment}\right) \tag{7}$$

where, $V_{SAXS}$ is the covariance matrix of the SAXS channel uncertainties, and T denotes the transpose.

In some examples, fitting analysis module 357 resolves at least one specimen parameter value by performing a fitting analysis on x-ray scatterometry measurement data 326 with the x-ray scatterometry response model 355. In some examples, $$\chi^2_{SAXS}$$

is optimized.

As described hereinbefore, the fitting of x-ray scatterometry data is achieved by minimization of chi-squared values. However, in general, the fitting of x-ray scatterometry data may be achieved by other functions.

The fitting of x-ray scatterometry metrology data is advantageous for any type of x-ray scatterometry technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing x-ray scatterometry beam interaction with the specimen are used.

In general, computing system 330 is configured to access model parameters in real-time, employing Real Time Critical Dimensioning (RTCD), or it may access libraries of pre-computed models for determining a value of at least one specimen parameter value associated with the specimen 301. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In addition, in some embodiments, the computing system 330 is further configured to receive user input 313 from a user input source 303 such as a graphical user interface, keyboard, etc. The one or more computer systems are further configured to configure re-useable, parametric sub-structure models as described herein to generate a structural model of the semiconductor structure under measurement (e.g., structural model 352).

In some embodiments, measurement system 300 is further configured to store one or more re-useable, parametric sub-structure models 370 in a memory (e.g., memory 380).

Figure 18:
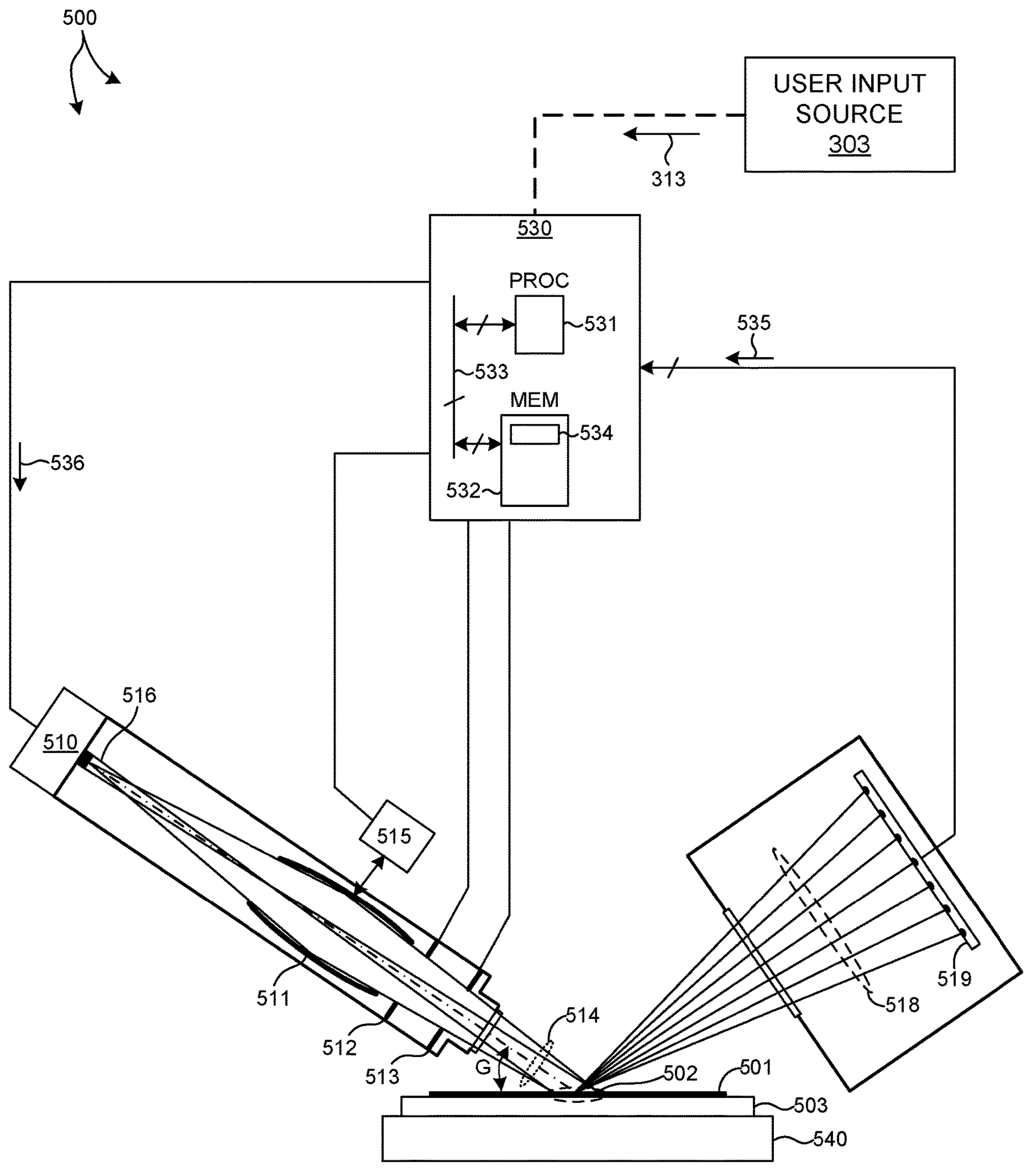
FIG. 18 is a diagram illustrative of another embodiment of an x-ray based metrology system for measuring characteristics of a semiconductor wafer based on measurement models including re-useable, parametric structure models of semiconductor structures as described herein.

FIG. 18 illustrates an embodiment of a soft x-ray reflectometry (SXR) metrology tool 500 for measuring characteristics of a specimen. In some embodiments, SXR measurements of a semiconductor wafer are performed over a range of wavelengths, angles of incidence, and azimuth angles with a small beam spot size (e.g., less than 50 micrometers across the effective illumination spot). In one aspect, the SXR measurements are performed with x-ray radiation in the soft x-ray region (i.e., 30-3000 eV) at grazing angles of incidence in the range of 5-20 degrees. Grazing angles for a particular measurement application are selected to achieve a desired penetration into the structure under measurement and maximize measurement information content with a small beam spot size (e.g., less than 50 micrometers).

As illustrated in FIG. 18, the system 500 performs SXR measurements over a measurement area 502 of a specimen 501 illuminated by an incident illumination beam spot.

In the depicted embodiment, metrology tool 500 includes an x-ray illumination source 510, focusing optics 511, beam divergence control slit 512, and slit 513. The x-ray illumination source 510 is configured to generate Soft X-ray radiation suitable for SXR measurements. X-ray illumination source 510 is a polychromatic, high-brightness, large etendue source. In some embodiments, the x-ray illumination source 510 is configured to generate x-ray radiation in a range between 30-3000 electron-volts. In general, any suitable high-brightness x-ray illumination source capable of generating high brightness Soft X-ray at flux levels sufficient to enable high-throughput, inline metrology may be contemplated to supply x-ray illumination for SXR measurements.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 510 is a high harmonic generation (HHG) x-ray source. In some other embodiments, illumination source 510 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some other embodiments, illumination source 510 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant Soft X-ray regions. For example, plasma emitted by Krypton provides high brightness at the Silicon K-edge. In another example, plasma emitted by Xenon provides high brightness throughout the entire Soft X-ray region of (80-3000 eV). As such, Xenon is a good choice of emitting material when broadband Soft X-ray illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary Soft X-ray illumination source is described in U.S. patent application Ser. No. 15/867,633, the content of which is incorporated herein by reference in its entirety.

In a further aspect, the wavelengths emitted by the illumination source (e.g., illumination source 510) are selectable. In some embodiments, illumination source 510 is a LPP light source controlled by computing system 530 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating Soft X-ray radiation. As depicted in FIG. 18, computing system 530 communicates command signals 536 to illumination source 510 that cause illumination source 510 to adjust the spectral range of wavelengths emitted from illumination source 510. In one example, illumination source 510 is a LPP light source, and the LPP light source adjusts any of a pulse duration, pulse frequency, and target material composition to realize a desired spectral range of wavelengths emitted from the LPP light source.

By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 510.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 510 produces x-ray emission over a source area having finite lateral dimensions (i.e., non-zero dimensions orthogonal to the beam axis. In one aspect, the source area of illumination source 510 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In general, x-ray optics shape and direct x-ray radiation to specimen 501. In some examples, the x-ray optics collimate or focus the x-ray beam onto measurement area 502 of specimen 501 to less than 1 milliradian divergence using multilayer x-ray optics. In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

As depicted in FIG. 18, focusing optics 511 focuses source radiation onto a metrology target located on specimen 501. The finite lateral source dimension results in finite spot size 502 on the target defined by the rays 516 coming from the edges of the source and any beam shaping provided by beam slits 512 and 513.

In some embodiments, focusing optics 511 includes elliptically shaped focusing optical elements. In the embodiment depicted in FIG. 18, the magnification of focusing optics 511 at the center of the ellipse is approximately one. As a result, the illumination spot size projected onto the surface of specimen 501 is approximately the same size as the illumination source, adjusted for beam spread due to the nominal grazing incidence angle (e.g., 5-20 degrees).

In a further aspect, focusing optics 511 collect source emission and select one or more discrete wavelengths or spectral bands, and focus the selected light onto specimen 501 at grazing angles of incidence in the range 5-20 degrees.

The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility SXR measurements probe more deeply into the structure with less sensitivity to the precise value of the grazing incidence angle.

In some embodiments, focusing optics 511 include graded multi-layers that select desired wavelengths or ranges of wavelengths for projection onto specimen 501. In some examples, focusing optics 511 includes a graded multi-layer structure (e.g., layers or coatings) that selects one wavelength and projects the selected wavelength onto specimen 501 over a range of angles of incidence. In some examples, focusing optics 511 includes a graded multi-layer structure that selects a range of wavelengths and projects the selected wavelengths onto specimen 501 over one angle of incidence. In some examples, focusing optics 511 includes a graded multi-layer structure that selects a range of wavelengths and projects the selected wavelengths onto specimen 501 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 501, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some embodiments, focusing optics 511 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged each at set at a different angle of incidence. In some embodiments, the multiple sets of reflective optical elements simultaneously project illumination light onto specimen 501 during measurement. In some other embodiments, the multiple sets of reflective optical elements sequentially project illumination light onto specimen 501 during measurement. In these embodiments, active shutters or apertures are employed to control the illumination light projected onto specimen 501.

In some embodiments, focusing optics 511 focus light at multiple wavelengths, azimuths and AOI on the same metrology target area.

In a further aspect, the ranges of wavelengths, AOI, Azimuth, or any combination thereof, projected onto the same metrology area, are adjusted by actively positioning one or more mirror elements of the focusing optics. As depicted in FIG. 18, computing system 530 communicates command signals to actuator system 515 that causes actuator system 515 to adjust the position, alignment, or both, of one or more of the optical elements of focusing optics 511 to achieve the desired ranges of wavelengths, AOI, Azimuth, or any combination thereof, projected onto specimen 501.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an SXR metrology system (e.g., metrology tool 500) includes one or more beam slits or apertures to shape the illumination beam 514 incident on specimen 501 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, an SXR metrology system (e.g., metrology tool 500) includes one or more beam slits or apertures to select a set of illumination wavelengths that simultaneously illuminate a metrology target under measurement. In some embodiments, illumination including multiple wavelengths is simultaneously incident on a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 18 depicts a beam divergence control slit 512 located in the beam path between focusing optics 511 and beam shaping slit 513. Beam divergence control slit 512 limits the divergence of the illumination provided to the specimen under measurement. Beam shaping slit 513 is located in the beam path between beam divergence control slit 512 and specimen 501. Beam shaping slit 513 further shapes the incident beam 514 and selects the illumination wavelength (s) of incident beam 514. Beam shaping slit 513 is located in the beam path immediately before specimen 501. In one aspect, the slits of beam shaping slit 513 are located in close proximity to specimen 501 to minimize the enlargement of the incident beam spot size due to beam divergence defined by finite source size.

In some embodiments, beam shaping slit 513 includes multiple, independently actuated beam shaping slits. In one embodiment, beam shaping slit 513 includes four independently actuated beam shaping slits. These four beams shaping slits effectively block a portion of the incoming beam and generate an illumination beam 514 having a box shaped illumination cross-section.

Slits of beam shaping slit 513 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

X-ray detector 519 collects x-ray radiation 518 scattered from specimen 501 and generates an output signals 535 indicative of properties of specimen 501 that are sensitive to the incident x-ray radiation in accordance with a SXR measurement modality. In some embodiments, scattered x-rays 518 are collected by x-ray detector 519 while specimen positioning system 540 locates and orients specimen 501 to produce angularly resolved scattered x-rays.

In some embodiments, a SXR system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 530 via output signals 535 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, a SXR system is employed to determine properties of a specimen (e.g., structural parameter values) based on one or more diffraction orders of scattered light. As depicted in FIG. 18, metrology tool 500 includes a computing system 530 employed to acquire signals 535 generated by detector 519 and determine properties of the specimen based at least in part on the acquired signals.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In one aspect, metrology tool 500 includes a wafer chuck 503 that fixedly supports wafer 501 and is coupled to specimen positioning system 540. Specimen positioning system 540 configured to actively position specimen 501 in six degrees of freedom with respect to illumination beam 514. In one example, computing system 530 communicates command signals (not shown) to specimen positioning system 540 that indicate the desired position of specimen 501. In response, specimen positioning system 540 generates command signals to the various actuators of specimen positioning system 540 to achieve the desired positioning of specimen 501.

In some examples, metrology based on SXR involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

Additional description of soft x-ray based metrology systems is provided in U.S. Patent Publication No. 2019/0017946, the content of which is incorporated herein by reference in its entirety.

In another further aspect, computing system 530 is configured to generate a structural model (e.g., geometric model, material model, or combined geometric and material model) of a measured structure of a specimen, generate a SXR response model that includes at least one geometric parameter from the structural model, and resolve at least one specimen parameter value by performing a fitting analysis of SXR measurement data with the SXR response model. The analysis engine is used to compare the simulated SXR signals with measured data thereby allowing the determination of geometric as well as material properties such as electron density of the sample. In the embodiment depicted in FIG. 18, computing system 530 is configured as a model building and analysis engine (e.g., model building and analysis engine 350) configured to implement model building and analysis functionality as described with reference to FIG. 17.

In addition, in some embodiments, the computing system 530 is further configured to receive user input 313 from a user input source 303 such as a graphical user interface, keyboard, etc. The one or more computer systems are further configured to configure re-useable, parametric sub-structure models as described herein to generate a structural model of the semiconductor structure under measurement and store one or more re-useable, parametric sub-structure models in a memory (e.g., memory 532).

It should be recognized that the various steps described throughout the present disclosure may be carried out by single computer systems 116, 330, and 530, or, alternatively, multiple computer systems 116, 330, and 530. Moreover, different subsystems of systems 100, 300, and 500, such as the spectroscopic ellipsometer 101, may include a computer system suitable for carrying out at least a portion of the steps described herein. Therefore, the aforementioned description should not be interpreted as a limitation on the present invention but merely an illustration. Further, the one or more computing systems 116 may be configured to perform any other step(s) of any of the method embodiments described herein.

The computing systems 116, 330, and 530 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. In general, computing systems 116, 330, and 530 may be integrated with a measurement system such as measurement systems 100, 300, and 500, respectively, or alternatively, may be separate from any measurement system. In this sense, computing systems 116, 330, and 530 may be remotely located and receive measurement data and user input from any measurement source and user input source, respectively.

Program instructions 120 implementing methods such as those described herein may be transmitted over or stored on carrier medium 118. The carrier medium may be a transmission medium such as a wire, cable, or wireless transmission link. The carrier medium may also include a computer-readable medium such as a read-only memory, a random access memory, a magnetic or optical disk, or a magnetic tape.

Similarly, program instructions 334 implementing methods such as those described herein may be transmitted over a transmission medium such as a wire, cable, or wireless transmission link. For example, as illustrated in FIG. 4, program instructions stored in memory 332 are transmitted to processor 331 over bus 333. Program instructions 334 are stored in a computer readable medium (e.g., memory 332). Exemplary computer-readable media include read-only memory, a random access memory, a magnetic or optical disk, or a magnetic tape.

Similarly, program instructions 534 implementing methods such as those described herein may be transmitted over a transmission medium such as a wire, cable, or wireless transmission link. For example, as illustrated in FIG. 18, program instructions stored in memory 532 are transmitted to processor 531 over bus 533. Program instructions 534 are stored in a computer readable medium (e.g., memory 532). Exemplary computer-readable media include read-only memory, a random access memory, a magnetic or optical disk, or a magnetic tape.

Although the methods discussed herein are explained with reference to systems 100, 300, and 500, any optical or x-ray metrology system configured to illuminate and detect light reflected, transmitted, or diffracted from a specimen may be employed to implement the exemplary methods described herein. Exemplary systems include an angle-resolved reflectometer, a scatterometer, a reflectometer, an ellipsometer, a spectroscopic reflectometer or ellipsometer, a beam profile reflectometer, a multi-wavelength, two-dimensional beam profile reflectometer, a multi-wavelength, two-dimensional beam profile ellipsometer, a rotating compensator spectroscopic ellipsometer, an optically modulated reflectometer, an optically modulated ellipsometer, a transmissive x-ray scatterometer, a reflective x-ray scatterometer, etc. By way of non-limiting example, an ellipsometer may include a single rotating compensator, multiple rotating compensators, a rotating polarizer, a rotating analyzer, a modulating element, multiple modulating elements, or no modulating element.

It is noted that the output from a source and/or target measurement system may be configured in such a way that the measurement system uses more than one technology. In fact, an application may be configured to employ any combination of available metrology sub-systems within a single tool, or across a number of different tools.

A system implementing the methods described herein may also be configured in a number of different ways. For example, a wide range of wavelengths (including visible, ultraviolet, infrared, and X-ray), angles of incidence, states of polarization, and states of coherence may be contemplated. In another example, the system may include any of a number of different light sources (e.g., a directly coupled light source, a laser-sustained plasma light source, etc.). In another example, the system may include elements to condition light directed to or collected from the specimen (e.g., apodizers, filters, etc.).

In general, the optical dispersion properties of semiconductor structures under measurement may be approximated as isotropic. Under this assumption the material parameters provided as input to the re-useable, parametric building blocks are scalar values.

Alternatively, the optical dispersion properties of semiconductor structures under measurement may be more accurately modelled as anisotropic. Under this assumption, the material parameters provided as input to the re-useable, parametric building blocks will be a matrix of different values, rather than a scalar value. Additional details regarding the treatment of anisotropic structures under measurement is described in U.S. Patent Publication No. 2018/0059019, the content of which is incorporated herein by reference in its entirety.

Figure 19:
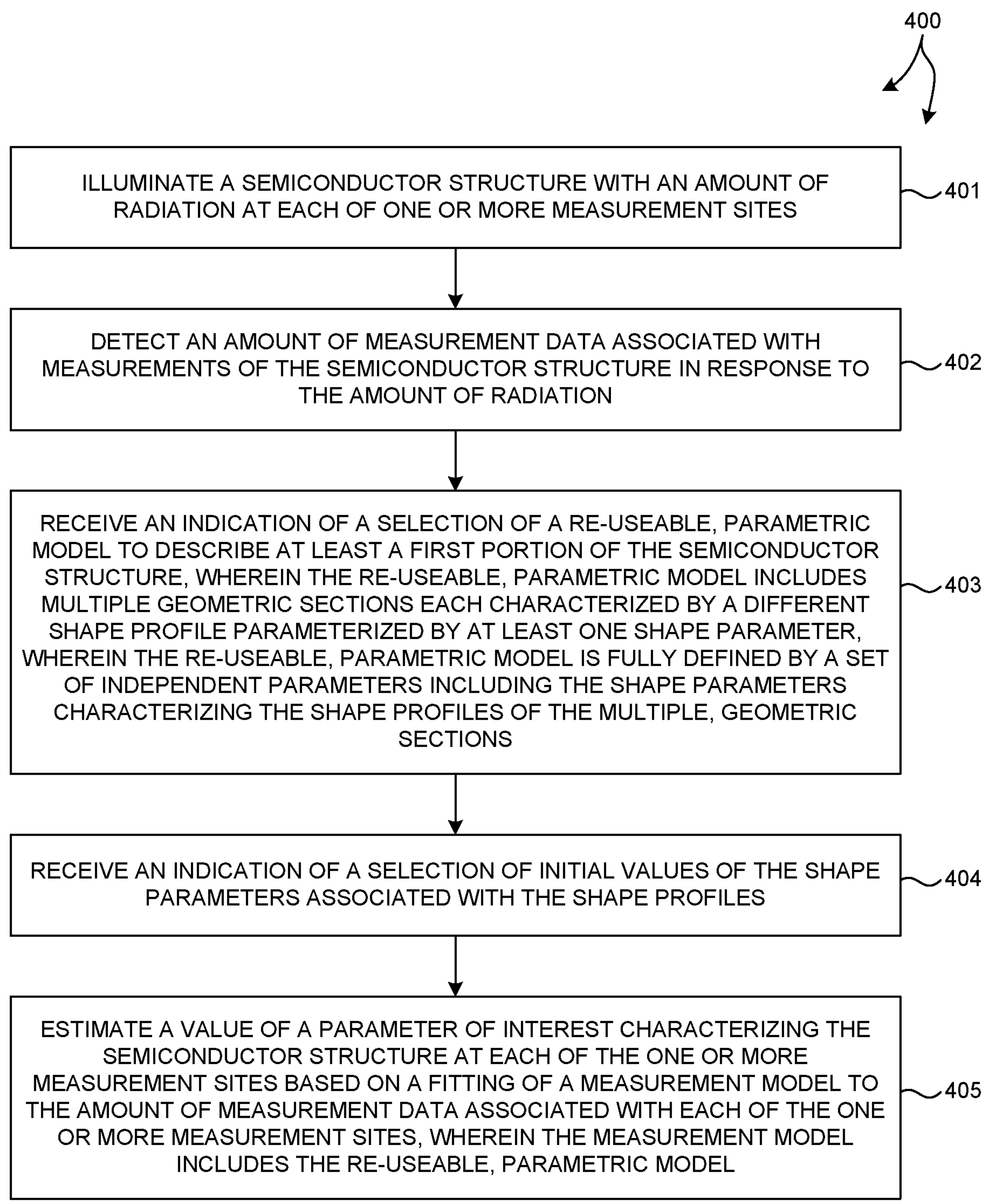
FIG. 19 illustrates a method 400 for measuring semiconductor structures based on measurement models including re-useable, parametric geometric structure models as described herein.

FIG. 19 illustrates a method 400 suitable for implementation by the metrology systems 100, 300, and 500 of the present invention. In one aspect, it is recognized that data processing blocks of method 400 may be carried out via a pre-programmed algorithm executed by one or more processors of computing systems 130, 330, or 530. While the following description is presented in the context of metrology systems 100, 300, and 500, it is recognized herein that the particular structural aspects of metrology systems 100, 300, and 500 do not represent limitations and should be interpreted as illustrative only.

In block 401, a semiconductor structure is illuminated with an amount of radiation at each of one or more measurement sites.

In block 402, an amount of measurement data associated with measurements of the semiconductor structure is detected in response to the amount of radiation.

In block 403, an indication of a selection of a re-useable, parametric model to describe at least a first portion of the semiconductor structure is received. The re-useable, parametric model includes multiple geometric sections each characterized by a different shape profile parameterized by at least one shape parameter. The re-useable, parametric model is fully defined by a set of independent parameters including the shape parameters characterizing the shape profiles of the multiple, geometric sections.

In block 404, an indication of a selection of initial values of the shape parameters associated with the shape profiles is received.

In block 405, a value of a parameter of interest characterizing the semiconductor structure at each of the one or more measurement sites is estimated based on a fitting of a measurement model to the amount of measurement data associated with each of the one or more measurement sites. The measurement model includes the first re-useable, parametric model.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), a displacement between two or more structures (e.g., overlay displacement between overlaying grating structures, etc.), and a dispersion property value of a material used in the structure or part of the structure. Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a site, or sites, on a wafer, a reticle, or any other sample that may be processed (e.g., printed or inspected for defects) by means known in the art. In some examples, the specimen includes a single site having one or more measurement targets whose simultaneous, combined measurement is treated as a single specimen measurement or reference measurement. In some other examples, the specimen is an aggregation of sites where the measurement data associated with the aggregated measurement site is a statistical aggregation of data associated with each of the multiple sites. Moreover, each of these multiple sites may include one or more measurement targets associated with a specimen or reference measurement.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:

an illumination subsystem configured to illuminate a semiconductor structure with an amount of radiation at each of one or more measurement sites;

a detector configured to detect an amount of measurement data associated with measurements of the semiconductor structure in response to the amount of radiation; and a computing system configured to:

receive an indication of a selection of a re-useable, parametric model to describe a physical characteristic of at least a first portion of the semiconductor structure, wherein the re-useable, parametric model includes multiple geometric sections each characterized by a different shape profile parameterized by at least one shape parameter, wherein the re-useable, parametric model is fully defined by a set of independent parameters including the shape parameters characterizing the shape profiles of the multiple, geometric sections;

receive an indication of a selection of initial values of the shape parameters associated with the shape profiles; and estimate a value of a parameter of interest characterizing the physical characteristic of the semiconductor structure at each of the one or more measurement sites based on a fitting of a measurement model to the amount of measurement data associated with each of the one or more measurement sites, wherein the measurement model includes the re-useable, parametric model.

2. The metrology system of claim 1, wherein at least one or the multiple geometric sections includes a plurality of subsections, each subsection characterized by a different shape profile parameterized by at least one shape parameter.

3. The metrology system of claim 1, wherein a first of the multiple geometric sections is parameterized by a first set of parameters and a second of the multiple geometric sections is parameterized by a second set of parameters, wherein the first set of parameters includes a different number of parameters than the second set of parameters.

4. The metrology system of claim 1, wherein a first of the multiple geometric sections is parameterized by a first set of parameters and a second of the multiple geometric sections is parameterized by a second set of parameters, wherein the first set of parameters includes the same number of parameters as the second set of parameters.

5. The metrology system of claim 1, wherein the semiconductor structure under measurement is a high aspect ratio structure, and wherein the parameter of interest is a critical dimension of the high aspect ratio structure.

6. The metrology system of claim 5, wherein the high aspect ratio structure under measurement includes at least 400 layers.

7. The metrology system of claim 1, wherein the semiconductor structure is fabricated on a wafer, and wherein the semiconductor structure is oriented in a direction normal to a planar surface of the wafer.

8. The metrology system of claim 1, wherein a height of each of the multiple geometric sections is characterized by a height ratio defined with respect to at least one of the other multiple geometric sections.

9. The metrology system of claim 1, wherein the illumination subsystem and the detector comprise an optical metrology system or an x-ray based metrology system.

10. The metrology system of claim 1, wherein the selection of the shape profiles associated with each of the multiple geometric sections and the selection of the initial values of the shape parameters associated with the shape profiles involves a trained library selection function based on a reference shape profile associated with the semiconductor structure under measurement.

11. The metrology system of claim 1, wherein the fitting of the measurement model to the amount of measurement data associated with each of the one or more measurement sites involves a regression on the values of the set of independent parameters.

12. A method comprising:

illuminating a semiconductor structure with an amount of radiation at each of one or more measurement sites;

detecting an amount of measurement data associated with measurements of the semiconductor structure in response to the amount of radiation;

receiving an indication of a selection of a re-useable, parametric model to describe a physical characteristic of at least a first portion of the semiconductor structure, wherein the re-useable, parametric model includes multiple geometric sections each characterized by a different shape profile parameterized by at least one shape parameter, wherein the re-useable, parametric model is fully defined by a set of independent parameters including the shape parameters characterizing the shape profiles of the multiple, geometric sections;

receiving an indication of a selection of initial values of the shape parameters associated with the shape profiles; and estimating a value of a parameter of interest characterizing the physical characteristic of the semiconductor structure at each of the one or more measurement sites based on a fitting of a measurement model to the amount of measurement data associated with each of the one or more measurement sites, wherein the measurement model includes the re-useable, parametric model.

13. The method of claim 12, wherein at least one or the multiple geometric sections includes a plurality of subsections, each subsection characterized by a different shape profile parameterized by at least one shape parameter.

14. The method of claim 12, wherein a first of the multiple geometric sections is parameterized by a first set of parameters and a second of the multiple geometric sections is parameterized by a second set of parameters, wherein the first set of parameters includes a different number of parameters than the second set of parameters.

15. The method of claim 12, wherein the semiconductor structure under measurement is a high aspect ratio structure, and wherein the parameter of interest is a critical dimension of the high aspect ratio structure.

16. The method of claim 12, wherein a height of each of the multiple geometric sections is characterized by a height ratio defined with respect to at least one of the other multiple geometric sections.

17. The method of claim 12, wherein the selection of the shape profiles associated with each of the multiple geometric sections and the selection of the initial values of the shape parameters associated with the shape profiles involves a trained library selection function based on a reference shape profile associated with the semiconductor structure under measurement.

18. The method of claim 12, wherein the fitting of the measurement model to the amount of measurement data associated with each of the one or more measurement sites involves a regression on the values of the set of independent parameters.

19. A metrology system comprising:

an illumination subsystem configured to illuminate a semiconductor structure with an amount of radiation at each of one or more measurement sites;

a detector configured to detect an amount of measurement data associated with measurements of the semiconductor structure in response to the amount of radiation; and a computing system configured to:

receive an indication of a selection of a re-useable, parametric model to describe at least a portion of the semiconductor structure, wherein the re-useable, parametric model is fully defined by a set of independent parameter values, wherein the re-useable, parametric model describes a nanowire or nanosheet having any of a rounded square cross-section, a rounded trapazoid cross-section, a rounded diamond cross-section, and a rounded triangle cross-section;

receive an indication of a selection of the set of independent parameter values; and estimate a value of a parameter of interest characterizing the semiconductor structure at each of the one or more measurement sites based on a fitting of a measurement model to the amount of measurement data associated with each of the one or more measurement sites, wherein the measurement model includes the re-useable, parametric model.

20. The metrology system of claim 19, wherein the re-useable, parametric model includes a uniform, conformal wrapper model or a non-uniform, conformal wrapper model.

* * * * *